US009929099B2

(12) United States Patent
Nguyen et al.

(10) Patent No.: US 9,929,099 B2
(45) Date of Patent: Mar. 27, 2018

(54) PLANARIZED INTERLAYER DIELECTRIC WITH AIR GAP ISOLATION

(71) Applicant: Samsung Electronics Co., Ltd., Suwon-si (KR)

(72) Inventors: VietHa Nguyen, Yongin-si (KR); Wookyung You, Incheon (KR); Inoue Naoya, Seongnam-si (KR); Hak-Sun Lee, Suwon-si (KR); Byung-Kwon Cho, Suwon-si (KR); Songyi Han, Hwaseong-si (KR); Jongmin Baek, Seoul (KR); Jiwon Kang, Seoul (KR); Byunghee Kim, Seoul (KR); Young-Ju Park, Hwaseong-si (KR); Sanghoon Ahn, Goyang-si (KR); Jiwon Yun, Hwaseong-si (KR); Naein Lee, Seoul (KR); YoungWoo Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/357,299

(22) Filed: Nov. 21, 2016

(65) Prior Publication Data

US 2017/0170184 A1 Jun. 15, 2017

(30) Foreign Application Priority Data

Dec. 14, 2015 (KR) .................. 10-2015-0178376

(51) Int. Cl.
*H01L 23/48* (2006.01)
*H01L 23/532* (2006.01)
*H01L 23/522* (2006.01)

(52) U.S. Cl.
CPC .... *H01L 23/53295* (2013.01); *H01L 23/5222* (2013.01); *H01L 23/53238* (2013.01); *H01L 23/53266* (2013.01)

(58) Field of Classification Search
CPC ........... H01L 21/7682; H01L 23/53295; H01L 23/528; H01L 21/76877; H01L 23/53238; H01L 23/53266; H01L 21/76849; H01L 23/53223; H01L 21/76831; H01L 23/5226; H01L 21/764; H01L 21/76802; H01L 21/76843; H01L 21/76834; H01L 21/76829; H01L 21/76807
See application file for complete search history.

(56) References Cited

U.S. PATENT DOCUMENTS 5,776,833 A * 7/1998 Chen .................... H01L 21/7684
257/E21.583
5,814,888 A 9/1998 Nishioka et al.
6,159,845 A 12/2000 Yew et al.
6,376,330 B1 4/2002 Fulford, Jr. et al.
(Continued)

FOREIGN PATENT DOCUMENTS

JP 2012049290 3/2012

*Primary Examiner* — Khiem D Nguyen
(74) *Attorney, Agent, or Firm* — Onello & Mello, LLP

(57) ABSTRACT

A semiconductor device includes an interlayer insulating layer including a first insulating layer on a substrate, and a plurality of interconnections in the first insulating layer. The interlayer insulating layer includes a first region, and a second region including an air gap. The air gap is defined between a pair of the interconnections in the second region. A top surface of the first insulating layer of the first region is lower than a top surface of at least one of the interconnections in the first region.

15 Claims, 34 Drawing Sheets

(56) References Cited

U.S. PATENT DOCUMENTS

| | | |
|---|---|---|
| 7,473,632 B2 | 1/2009 | Ueda |
| 7,830,014 B2 | 11/2010 | Ueda |
| 7,879,683 B2 | 2/2011 | Al-Bayati et al. |
| 8,071,459 B2 | 12/2011 | Braeckelmann et al. |
| 8,288,268 B2 | 10/2012 | Edelstein et al. |
| 8,344,474 B2 | 1/2013 | Seidel et al. |
| 8,476,758 B2 | 7/2013 | Lin |
| 8,642,252 B2 | 2/2014 | Clevenger et al. |
| 9,123,727 B2 | 9/2015 | Fischer |
| 9,305,836 B1* | 4/2016 | Gates ................ H01L 21/28556 |
| 2009/0302475 A1 | 12/2009 | Korogi et al. |
| 2013/0323930 A1* | 12/2013 | Chattopadhyay . H01L 21/02107 |
| | | 438/703 |
| 2015/0091175 A1* | 4/2015 | Chandhok ......... H01L 21/76841 |
| | | 257/773 |
| 2015/0187699 A1* | 7/2015 | Baek ................ H01L 23/53223 |
| | | 257/773 |

* cited by examiner

PLANARIZED INTERLAYER DIELECTRIC WITH AIR GAP ISOLATION

CROSS-REFERENCE TO RELATED APPLICATIONS

This U.S. non-provisional patent application claims priority under 35 U.S.C. § 119 to Korean Patent Application No. 10-2015-0178376, filed on Dec. 14, 2015, in the Korean Intellectual Property Office, the disclosure of which is hereby incorporated by reference in its entirety.

FIELD

The present disclosure relates a semiconductor device and method for manufacturing the same. More specifically, the present disclosure relates planarizing a dielectric height in a semiconductor process having air gaps.

BACKGROUND

Semiconductor devices are widely used in the electronics industry because of their small sizes, multi-functional characteristics, and low manufacture costs. Several common categories of semiconductor devices include semiconductor memory devices to store logic data, semiconductor logic devices processing operations of the logic data, and hybrid semiconductor devices, which perform a variety of functions.

Highly integrated semiconductor devices have been increasingly demanded as the electronic industry continues to provide more functions and greater performance on a single device. Increased levels of integration may give rise to various manufacturing problems, for example a margin reduction of an exposure process defining fine patterns. Manufacture of semiconductor devices may become difficult due to these problems. In addition, high-speed semiconductor devices have been increasingly demanded with the development of the electronic industry. Various research has been conducted for new techniques capable of realizing high functional integration, high-speed or both in semiconductor devices.

Various packaging techniques have been developed to meet the electronic industry's demand for higher functional capacity, thinner and smaller semiconductor devices, including similar goals for the electronic products that include theses devices. In one package technique, various semiconductor devices ("chips") may be vertically stacked to realize a high-dense chip stack structure. According to this technique, semiconductor chips having various functions may be integrated on a smaller area than in a general package having one semiconductor chip.

SUMMARY

Embodiments of the inventive concepts may provide a semiconductor device capable of reducing or minimizing a capacitance between interconnections.

Embodiments of the inventive concepts may also provide a method of manufacturing a semiconductor device, which is capable of effectively reducing or minimizing a capacitance between interconnections through a simple process.

In an aspect, a semiconductor device may include an interlayer insulating layer including a first insulating layer on a substrate, and a plurality of interconnections in the first insulating layer. The interlayer insulating layer may include a first region and a second region including an air gap. The air gap may be defined between a pair of the interconnections in the second region, and a top surface of the first insulating layer of the first region may be lower than a top surface of at least one of the interconnections in the first region.

In an aspect, a semiconductor device may include a first interlayer insulating layer on a substrate, a plurality of first interconnections disposed in the first interlayer insulating layer, and barrier patterns between the first interlayer insulating layer and the first interconnections. The first interlayer insulating layer may include a first region and a second region including a first air gap. At least one of the first interconnections in the second region may include a first portion adjacent to the first air gap. A top surface of the first portion may be lower than a top surface of the barrier pattern.

In an aspect, a method of manufacturing a semiconductor device may include forming a plurality of interconnections in a first insulating layer on a substrate, the first insulating layer including a first region and a second region, forming a mask pattern that covers the first region and exposes the second region, etching the first insulating layer of the second region using the mask pattern as an etch mask to form an empty space between a pair of the interconnections in the second region, and forming a second insulating layer on the first insulating layer to form an air gap from the empty space. The mask pattern may be removed during the etching of the first insulating layer.

In an aspect, a method of manufacturing a semiconductor device comprises forming on a first insulator disposed on a substrate, a plurality of grooves having parallel alignment. The grooves have a first region wherein the grooves are loosely spaced to each other, and a second region wherein the grooves are tightly spaced to each other. A barrier is formed on a respective surface of each of the grooves. The barrier is configured to isolate a metallic species from the first insulator. A metallic conductor comprising the metallic species is formed on the respective barrier of each of the grooves. A mask is formed with an opening exposing the second region. A recessed region in the first insulator between each of the metallic conductors is formed with a first etch. The mask and the first insulator between each of the metallic conductors is removed with a second etch. A top surface of each of the metallic conductors is etched with the second etch. A second insulator is deposited on the first insulator to form an enclosed air gap between each metallic conductor.

BRIEF DESCRIPTION OF THE DRAWINGS

The inventive concepts will become more apparent in view of the attached drawings and accompanying detailed description.

DETAILED DESCRIPTION

Figure 1:
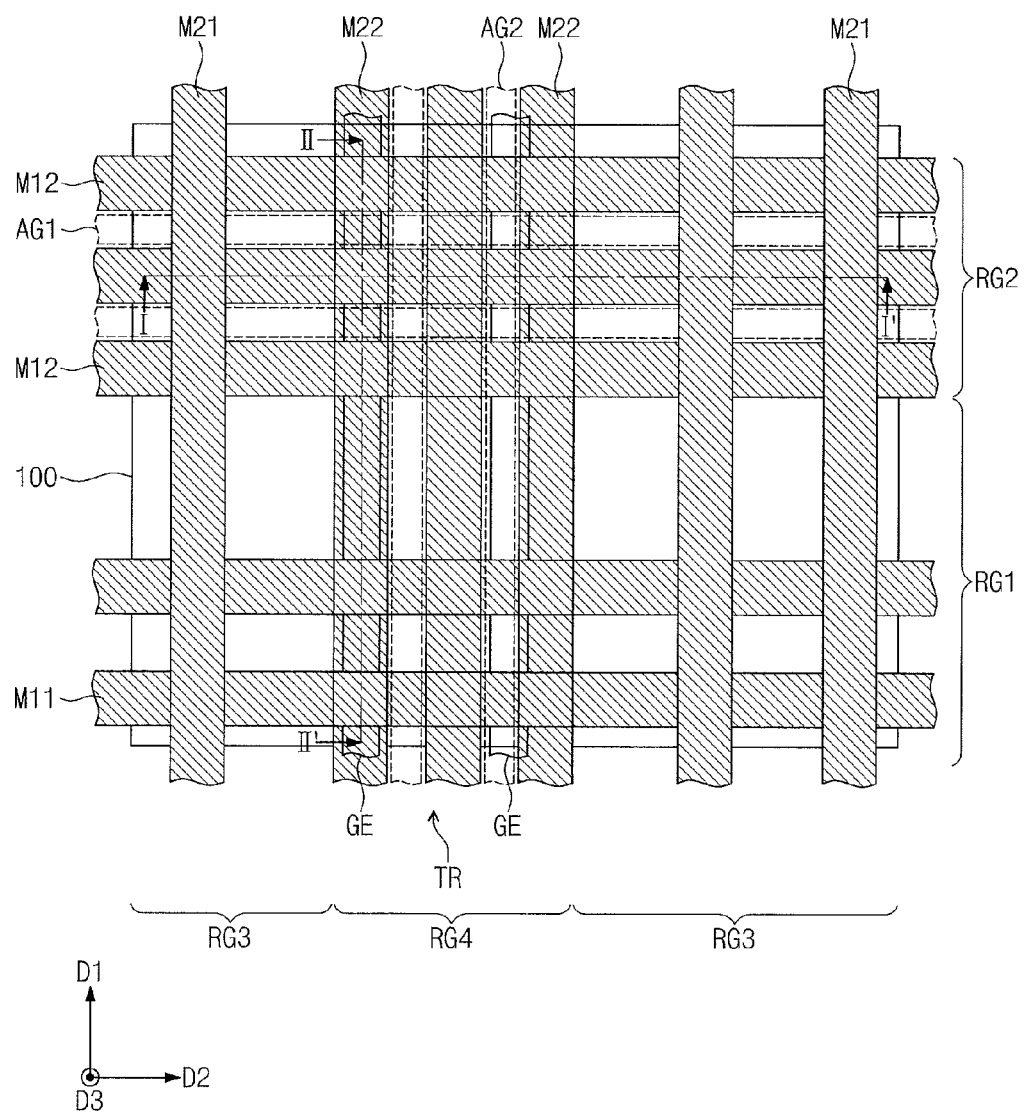
FIG. 1 is a plan view illustrating an embodiment of a semiconductor device according to the inventive concepts.

Exemplary embodiments of aspects of the present inventive concepts explained and illustrated herein include their complementary counterparts. The same reference numerals or the same reference designators denote the same elements throughout the specification.

Figure 2A:
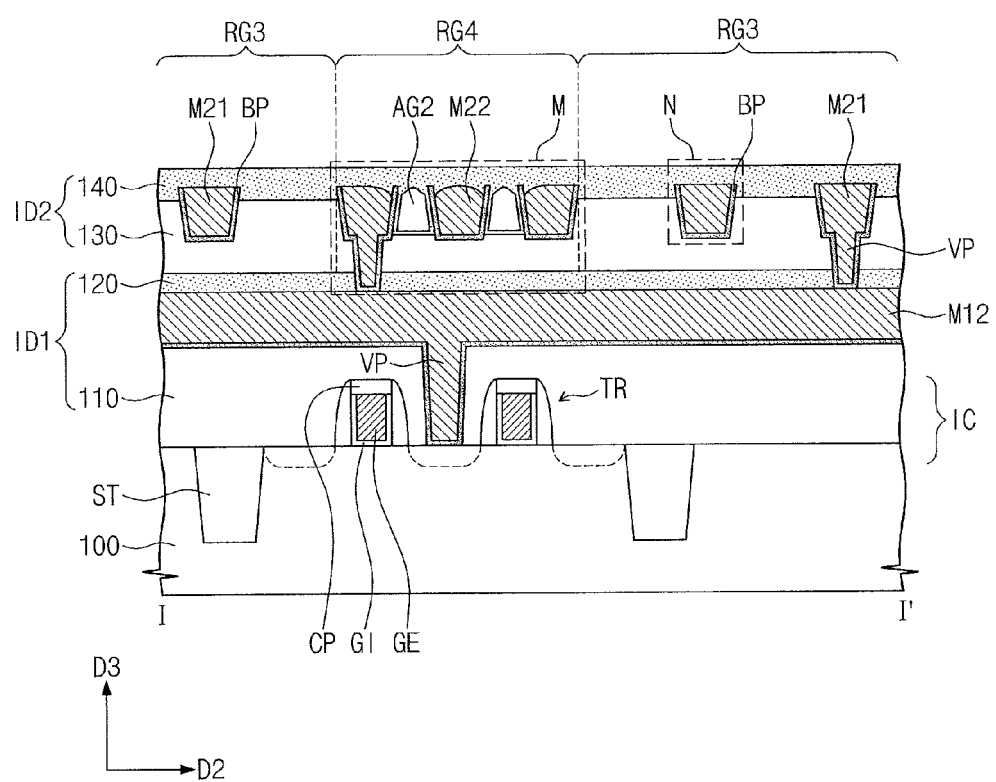
FIG. 2A and FIG. 2B are cross-sectional views taken along lines I-I' and II-II' of FIG. 1, respectively.
Figure 2B:
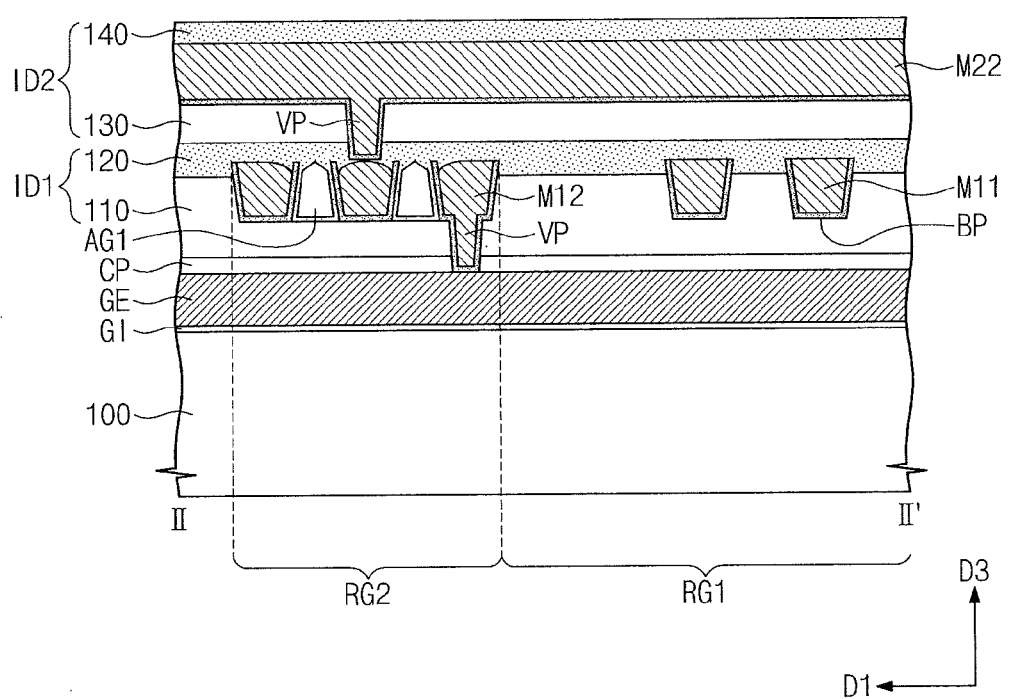
Figure 3A:
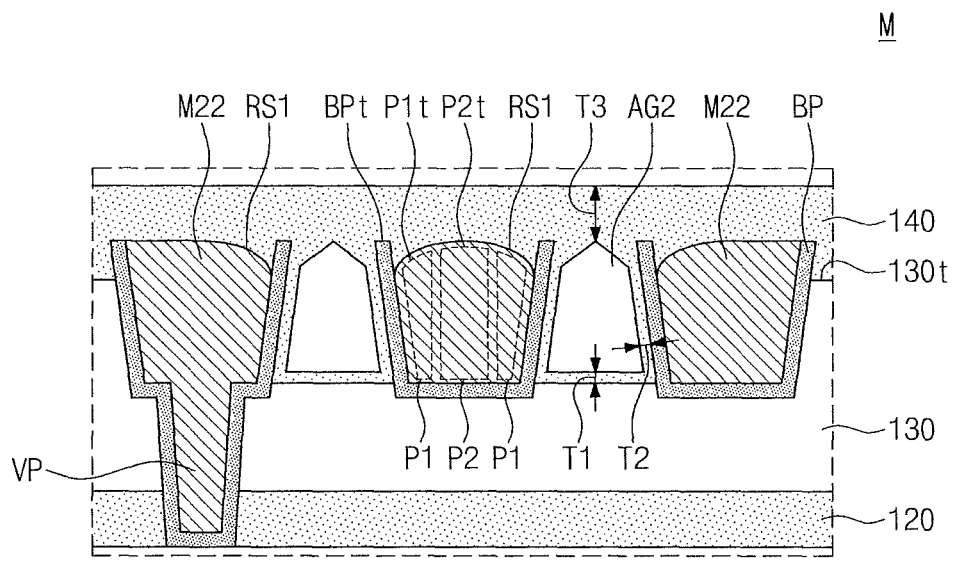
FIG. 3A and FIG. 3B are enlarged cross-sectional views of an embodiment of regions 'M' and 'N' of FIG. 2A, respectively.
Figure 3B:
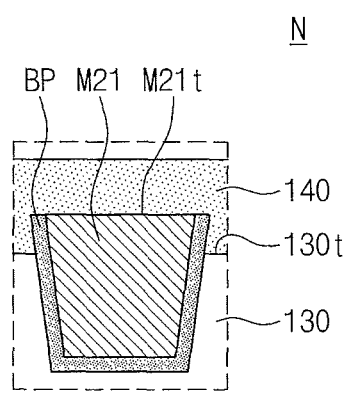
Figure 4A:
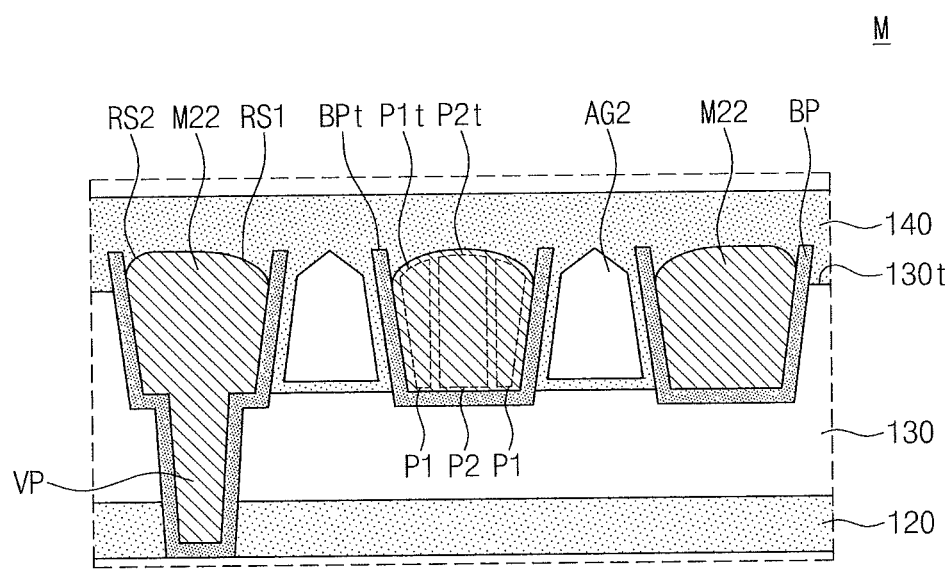
FIG. 4A and FIG. 4B are enlarged cross-sectional views of another embodiment of regions 'M' and 'N' of FIG. 2A, respectively.
Figure 4B:
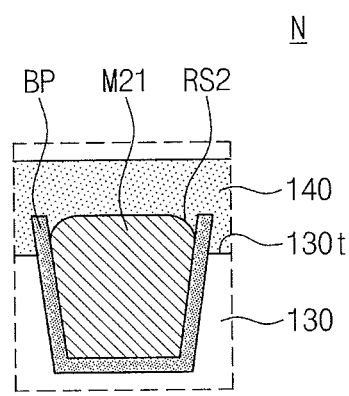

FIG. 1 is a plan view illustrating an embodiment of a semiconductor device according to the inventive concepts. FIG. 2A and FIG. 2B are cross-sectional views taken along lines I-I' and II-II' of FIG. 1, respectively. FIG. 3A and FIG. 3B are enlarged cross-sectional views of regions 'M' and 'N' of FIG. 2A, respectively, to illustrate a semiconductor device according to some embodiments of the inventive concepts. FIG. 4A and FIG. 4B are enlarged cross-sectional views of regions 'M' and 'N' of FIG. 2A, respectively, to illustrate a semiconductor device according to some embodiments of the inventive concepts.

Referring to FIG. 1, FIG. 2A, FIG. 2B, FIG. 3A, and FIG. 3B, an integrated circuit (IC) may be disposed on a substrate 100. For example, the substrate 100 may be a silicon substrate, a germanium substrate, or a silicon-germanium substrate. In some embodiments, the IC may include one or more of logic cells for processing data, a control circuit, and a power source circuit for controlling operations of the logic cells. In certain embodiments, the IC may include one ore more of memory cells for storing data, a control circuit, and a power source circuit for controlling operations of the memory cells.

The IC may include a plurality of transistors TR. The transistors TR may constitute the logic cells or the memory cells. Each of the transistors TR may include a gate electrode GE, a gate dielectric layer GI disposed between the gate electrode GE and the substrate 100, a capping pattern CP covering a top surface of the gate electrode GE, and dopant regions DR disposed at both sides of the gate electrode GE. The dopant regions DR may correspond to portions of the substrate 100, which are doped with dopants. In some embodiments, the gate electrode GE may have a linear shape extending in a first direction D1 parallel to a top surface of the substrate 100. Device isolation layers ST formed in the substrate 100 may be adjacent to the transistors TR. In one embodiment, the isolation layer is a shallow trench isolation.

A first interlayer insulating layer ID1 and a second interlayer insulating layer ID2 may be sequentially stacked on the substrate 100. The first interlayer insulating layer ID1 may include a first insulating layer 110 covering the transistors TR, and a second insulating layer 120 disposed on the first insulating layer 110. The second insulating layer 120 may cover top surfaces of lower interconnections M11 and M12 to be described below. The second interlayer insulating layer ID2 may include a third insulating layer 130 covering the second insulating layer 120, and a fourth insulating layer 140 disposed on the third insulating layer 130. The fourth insulating layer 140 may cover top surfaces of upper interconnections M21 and M22 to be described below. In some embodiments, each of the first and third insulating layers 110 and 130 may include a Silicon Oxide layer, and each of the second and fourth insulating layers 120 and 140 may include a Silicon Nitride layer or a Silicon Carbonitride (SiCN) layer.

The first interlayer insulating layer ID1 may include a first region RG1 and a second region RG2. The second region RG2 may be a region in which first air gaps AG1 to be described below are disposed. The second region RG2 corresponds to an area in which metal interconnects extending in the second direction D2 are tightly spaced to each other relative to the photolithographic limitations used to fabricate the IC. The second interlayer insulating layer ID2 may include a third region RG3 and a fourth region RG4. The fourth region RG4 may be a region in which second air gaps AG2 to be described below are disposed. The fourth region RG4 corresponds to an area in which metal interconnects extending in the first direction D1 are tightly spaced to each other relative to the photolithographic limitations used to fabricate the IC.

A plurality of lower interconnections M11 and M12 may be disposed in the first insulating layer 110. The lower interconnections M11 and M12 may have linear shapes extending in a second direction D2 intersecting the first direction D1. At least one of the lower interconnections M11 and M12 may have a vertical extension VP (e.g., a contact or a via) extending toward the substrate 100. In some embodiments, at least one of the lower interconnections M11 and M12 may be electrically connected to the dopant region DR through the vertical extension VP. In certain embodiments, at least one of the lower interconnections M11 and M12 may be electrically connected to the gate electrode GE through the vertical extension VP. The lower interconnections M11 and M12 may include a metal such as Copper (Cu) or Tungsten (W).

Barrier patterns BP may be disposed between the first insulating layer 110 and the lower interconnections M11 and M12, respectively. Each of the barrier patterns BP may directly cover a bottom surface and both sidewalls of each of the lower interconnections M11 and M12. The barrier patterns BP may prevent a metal material from being diffused from the lower interconnections M11 and M12 into the first interlayer insulating layer ID1. For example, the barrier patterns BP may include Titanium (Ti), Titanium Nitride (TiN), or a combination thereof.

The lower interconnections M11 and M12 may include first lower interconnections M11 disposed in the first region RG1 and second lower interconnections M12 disposed in the second region RG2. A pattern density of the first lower interconnections M11 in the first region RG1 may be different from a pattern density of the second lower interconnections M12 in the second region RG2. In some embodiments, the pattern density of the first lower interconnections M11 in the first region RG1 may be lower than the pattern density of the second lower interconnections M12 in the second region RG2. In other words, an average distance between the first lower interconnections M11 adjacent to each other may be greater than an average distance between the second lower interconnections M12 adjacent to each other.

First air gaps AG1 surrounded by the second insulating layer 120 may be defined between the second lower interconnections M12. In other words, each of the first air gaps AG1 may be disposed between a pair of the second lower interconnections M12 adjacent to each other. The second insulating layer 120 may not completely fill spaces between the second lower interconnections M12, and thus empty spaces between the second lower interconnections M12 may be defined as the first air gaps AG1. In some embodiments, the first air gaps AG1 may have linear shapes extending along the second lower interconnections M12 in the second direction D2 when viewed from a plan view. However, embodiments of the inventive concepts are not limited thereto. In one embodiment, the first air gaps AG1 are formed due to the lack of conformal coating of the second insulating layer 120 due to the relatively narrow spacing of the second lower interconnections M12. In another embodiment, the first air gaps AG1 are fruited by a combination of dry (e.g. plasma) and Hydrofluoric (HF) wet etching processes. Narrowly spaced interconnections may occur in dense circuit topologies, such as in memory cell arrays or programmable gate arrays.

Because the pattern density of the second lower interconnections M12 is relatively high, a parasitic capacitance between the second lower interconnections M12 may be increased. Thus, RC delay of a semiconductor device may be increased. However, the first air gaps AG1 may reduce dielectric constants between the second lower interconnections M12. As a result, an operating speed of the semiconductor device may be improved. The air gaps AG1 will also reduce parasitic coupling between adjacent interconnections (e.g., between adjacent bit lines in a memory array).

A top surface of the first insulating layer 110 of the first region RG1 may be higher than a top surface of the first insulating layer 110 of the second region RG2. Conversely, a top surface of the second insulating layer 120 of the first region RG1 may be substantially coplanar with a top surface of the second insulating layer 120 of the second region RG2. In one example, the first insulating layer 110 is conformally deposited, while the second insulating layer 120 is planarized after being deposited.

A plurality of upper interconnections M21 and M22 may be disposed in the third insulating layer 130. The upper interconnections M21 and M22 may have linear shapes extending in the first direction D1. At least one of the upper interconnections M21 and M22 may have a vertical extension VP extending toward the substrate 100. In some embodiments, at least one of the upper interconnections M21 and M22 may be electrically connected to at least one of the lower interconnections M11 and M12 through the vertical extension VP thereof. The upper interconnections M21 and M22 may include a metal such as Copper (Cu) or Tungsten (W). Barrier patterns BP may be disposed between the third insulating layer 130 and the upper interconnections M21 and M22, respectively. The barrier patterns BP between the third insulating layer 130 and the upper interconnections M21 and M22 may have the same or similar function as the barrier patterns BP between the first insulating layer 110 and the lower interconnections M11 and M12.

The upper interconnections M21 and M22 may include first upper interconnections M21 disposed in the third region RG3 and second upper interconnections M22 disposed in the fourth region RG4. A pattern density of the first upper interconnections M21 in the third region RG3 may be lower than a pattern density of the second upper interconnections M22 in the fourth region RG4.

Second air gaps AG2 surrounded by the fourth insulating layer 140 may be defined between the second upper interconnections M22. The fourth insulating layer 140 may not completely fill spaces between the second upper interconnections M22, and thus empty spaces between the second upper interconnections M22 may be defined as the second air gaps AG2. In some embodiments, the second air gaps AG2 may have linear shapes extending along the second upper interconnections M22 in the first direction D1 when viewed from a plan view. However, embodiments of the inventive concepts are not limited thereto. Dielectric constants between the second upper interconnections M22 may be reduced by the second air gaps AG2.

A top surface of the third insulating layer 130 of the third region RG3 may be higher than a top surface of the third insulating layer 130 of the fourth region RG4. Conversely, a top surface of the fourth insulating layer 140 of the third region RG3 may be substantially coplanar with a top surface of the fourth insulating layer 140 of the fourth region RG4. In one example, the third insulating layer 130 is conformally deposited, while the fourth insulating layer 140 is planarized after being deposited. In other embodiments, additional interlayer insulating layers and additional interconnections may be stacked on the second interlayer insulating layer ID2. However, embodiments of the inventive concepts are not limited thereto.

Referring again to FIG. 3A and FIG. 3B, each of the second upper interconnections M22 may have a first recess RS1 on an edge thereof. The first recess RS1 may be adjacent to the second air gap AG2. Thus, each of some of the second upper interconnections M22 may have one first recess RS1. The second upper interconnection M22 disposed between the second air gaps AG2 may also have a pair of the first recesses RS1 respectively formed on both edges thereof.

Specifically, the second upper interconnection M22 disposed between the second air gaps AG2 may include a pair of first portions P1 respectively adjacent to the second air gaps AG2 and a second portion P2 corresponding to a central portion thereof. The second portion P2 may be disposed between the pair of first portions P1. The pair of first recesses RS1 may exist on each of the pair of first portions P1, respectively. Top surfaces P1t of the first portions P1 may be lower than a top surface BPt of the barrier pattern BP. Here, the top surface BPt of the barrier pattern BP may be a top end of the barrier pattern BP. A top surface P2t of the second portion P2 may be disposed at substantially the same level as, or a lower level than, the top surface BPt of the barrier pattern BP. The first recesses RS1 may prevent metal atoms of the second upper interconnections M22 from moving to neighboring upper interconnections over the barrier patterns BP.

One or more of the second upper interconnections M22 may have one first portion P1 wherein the top surface P1t is lower than the top surface BPt of the barrier pattern BP. In contrast the top surfaces M21t of the first upper interconnections M21, (in the third region RG3), may be substantially coplanar with the top surface BPt of the barrier pattern BP. A top surface 130t of the third insulating layer 130 of the third region RG3 may be lower than the top surface M21t of the first upper interconnection M21.

A width of each of the second air gaps AG2 may gradually decrease as a vertical distance from the top surface of the substrate 100 (i.e., a height in a third direction D3) increases. In other words, each of the second air gaps AG2 may have an arrowhead shape with a point at the top as shown in FIG. 3A, or a pentagon with a wider base. A top of the second air gap AG2 may be higher than the top surface (e.g. P2t) of the second upper interconnection M22.

A thickness of the fourth insulating layer 140 surrounding the second air gap AG2 may vary. In some embodiments, the fourth insulating layer 140 under the second air gap AG2 may have a first thickness T1. The fourth insulating layer 140 at a side of the second air gap AG2 may have a second thickness T2. The minimum thickness of the fourth insulating layer 140 on top of the second air gap AG2 may be a third thickness T3. Here, the first thickness T1 may be greater than the second thickness T2, and the third thickness T3 may be greater than the first thickness T1.

FIG. 4A and FIG. 4B illustrate an embodiment of upper interconnections different from that shown in FIG. 3A and FIG. 3B, respectively. For clarity of explanation, the descriptions of the same technical features as in the embodiment of FIG. 3A and FIG. 3B will be omitted, or mentioned briefly, rather the differences between the embodiments will be described. Each of the first upper interconnections M21 may have a second recess RS2 formed on the edge opposing the first recess RS1. The pair of recesses formed by RS1 and RS2 may be recessed downward from the top surface BPt of the barrier pattern BP.

At least one of the second upper interconnections M22 may have a first recess RS1 formed on one edge adjacent to the second air gap AG2 and a second recess RS2 formed on another edge, as shown in FIG. 4A. Here, the first recess RS1 may be deeper than the second recess RS2. In other words, a bottom end of the first recess RS1 may be lower than a bottom end of the first recess RS2. However, the second upper interconnection M22 disposed between the second air gaps AG2 may have a pair of the first recesses RS1 respectively forming on both edges thereof. In other words, the second recess RS2 may not exist on the second upper interconnection M22 disposed between the second air gaps AG2. The first recesses RS1 and the second recesses RS2 may prevent metal atoms of the upper interconnections M21 and M22 from moving to neighboring upper interconnections over the barrier patterns BP.

In the above embodiments, the upper interconnections M21 and M22 and the second air gaps AG2 are primarily described with reference to FIG. 3A, FIG. 3B, FIG. 4A, and FIG. 4B. The lower interconnections M11 and M12 and their corresponding first air gaps AG1 may be described similarly to the descriptions provided for FIG. 3A, FIG. 3B, FIG. 4A, and FIG. 4B, and thus the descriptions thereto will be omitted for brevity.

FIGS. 5, 7, 9, 11, 13, 15, 17, 19, and 21 are plan views illustrating progressive views of an embodiment of a semiconductor device being manufactured according to the inventive concepts described herein. FIGS. 6A, 8A, 10A, 12A, 14A, 16A, 18A, 20A, and 22A are cross-sectional views taken along lines I-I' of FIGS. 5, 7, 9, 11, 13, 15, 17, 19, and 21, respectively. FIGS. 6B, 8B, 10B, 12B, 14B, 16B, 18B, 20B, and 22B are cross-sectional views taken along lines II-II' of FIGS. 5, 7, 9, 11, 13, 15, 17, 19, and 21, respectively.

Figure 5:
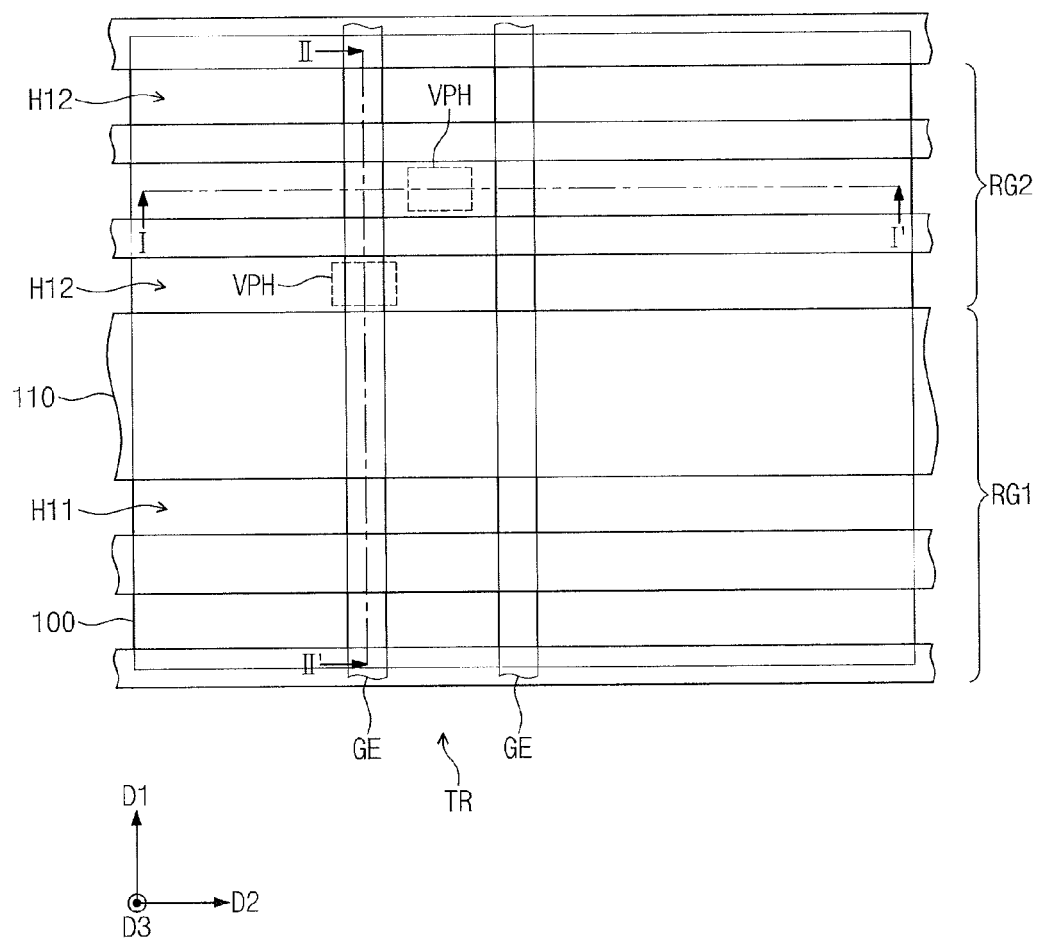
FIG. 5, FIG. 6A and FIG. 6B are a plan view, a cross-sectional view taken along lines I-I' of FIG. 5, and a cross-sectional view taken along II-IP of FIG. 5 respectively, illustrating the foil cation of an embodiment of a semiconductor device.
Figure 6A:
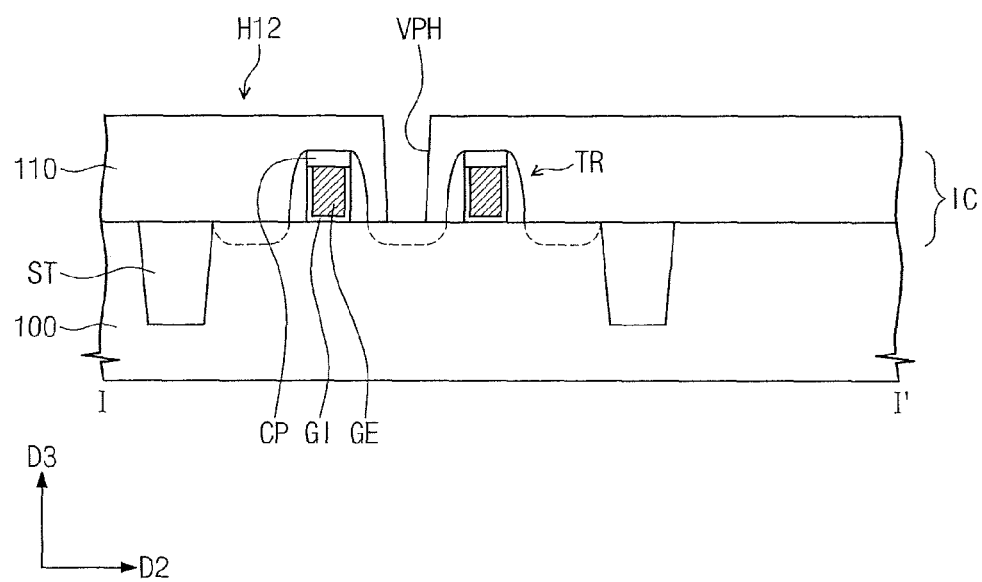
Figure 6B:
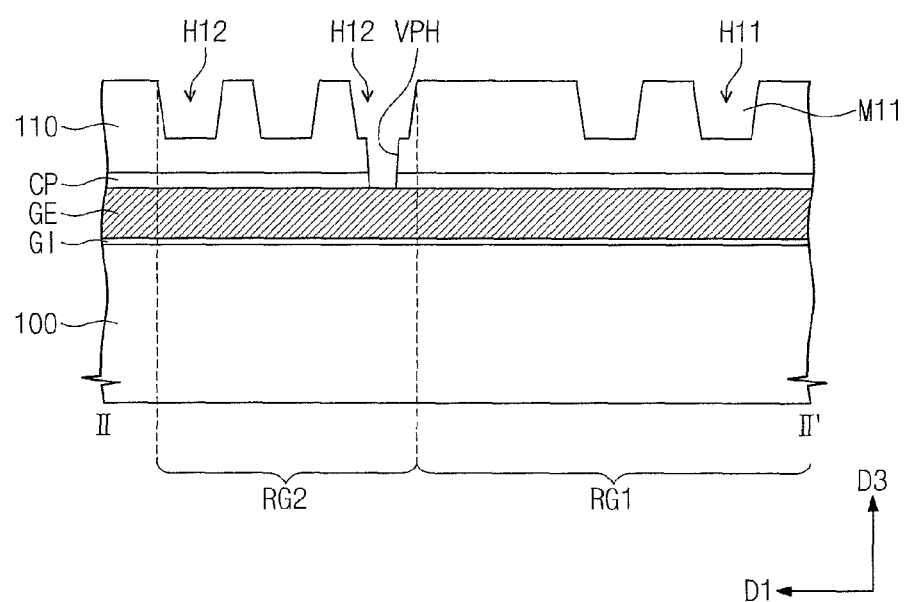

Referring to FIG. 5, FIG. 6A, and FIG. 6B, an IC may be formed on a substrate 100. For example, the substrate 100 may be a silicon substrate, a germanium substrate, or a silicon-germanium substrate.

Forming the IC may include forming a plurality of transistors TR. In some embodiments, device isolation layers ST (e.g. shallow trench isolation) may be formed in the substrate 100 to define active regions. A gate dielectric layer GI, a gate electrode GE, and a capping pattern CP may be formed on the active region. The gate electrode GE may intersect the active region, and the gate dielectric layer GI may be disposed between the gate electrode GE and the substrate 100. The capping pattern CP may cover a top surface of the gate electrode GE. Dopant regions DR may be formed at both sides of the gate electrode GE. The dopant regions DR may be formed by doping portions of the active region (e.g., the substrate 100), which are disposed at both sides of the gate electrode GE, with dopants. Subsequently, a first insulating layer 110 covering the transistors TR may be formed on an entire top surface of the substrate 100. The first insulating layer 110 may include a first region RG1 and a second region RG2. For example, the first insulating layer 110 may include a Silicon Oxide layer.

The first insulating layer 110 may be patterned to form lower interconnection grooves H11 and H12 extending in a second direction D2. The lower interconnection grooves H11 and H12 may be formed in an upper portion of the first insulating layer 110, and thus bottom surfaces of the lower interconnection grooves H11 and H12 may be higher than a bottom surface of the first insulating layer 110. In some embodiments, at least one of the lower interconnection grooves H11 and H12 may include a vertical extension hole VPH extending toward the substrate 100. In some embodiments, the vertical extension hole VPH may penetrate the first insulating layer 110 to expose a portion of the dopant region DR. In certain embodiments, the vertical extension hole VPH may penetrate the first insulating layer 110 and the capping pattern CP to expose a portion of the gate electrode GE. Thus the vertical extension hole VPH can be used to form a contact or via connection between metallic interconnect and active terminals of a semiconductor transistor.

The lower interconnection grooves H11 and H12 may include first lower interconnection grooves H11 disposed in the first region RG1 and second lower interconnection grooves H12 disposed in the second region RG2. In some embodiments, a pattern density of the first lower interconnection grooves H11 in the first region RG1 may be lower than a pattern density of the second lower interconnection grooves H12 in the second region RG2. In other words, the spacing between the grooves H12 in the second region RG2 is smaller than the spacing between the grooves H11 in the first region RG1.

Figure 7:
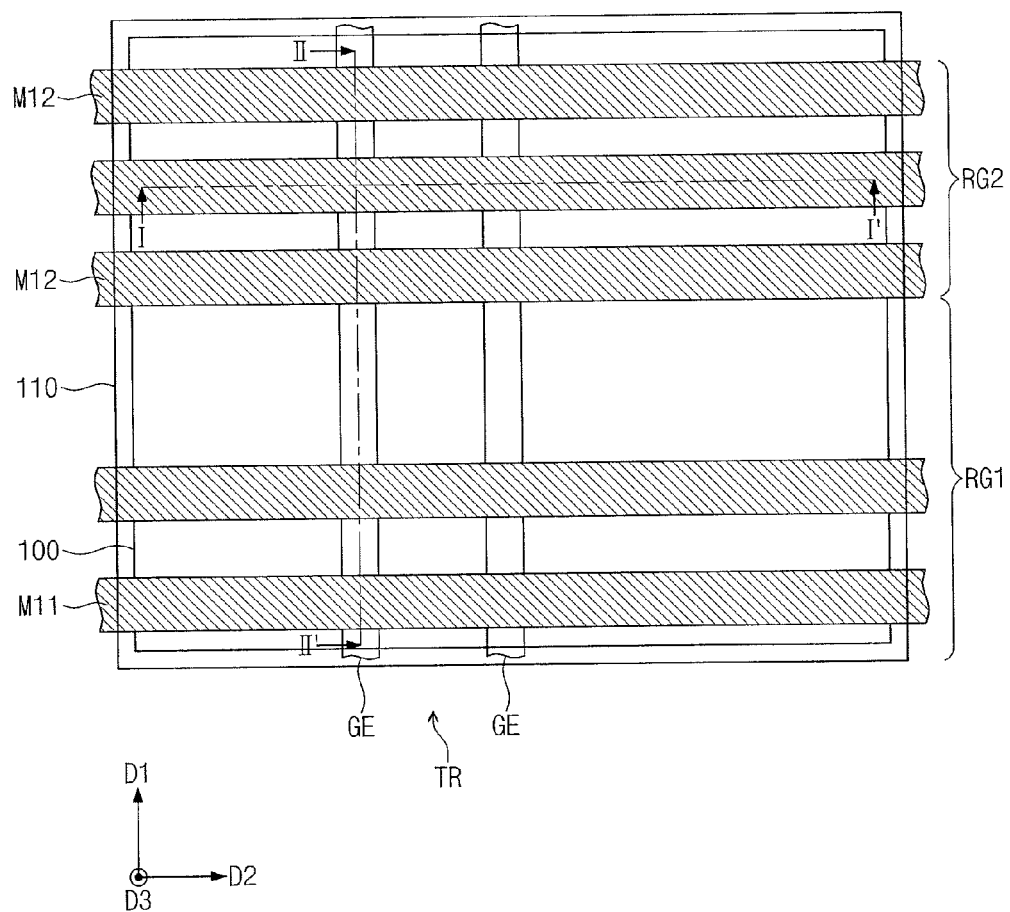
FIG. 7, FIG. 8A and FIG. 8B are a plan view, a cross-sectional view taken along lines I-I' of FIG. 7, and a cross-sectional view taken along II-II' of FIG. 7 respectively, illustrating the subsequent processing of the embodiment of FIG. 5.
Figure 8A:
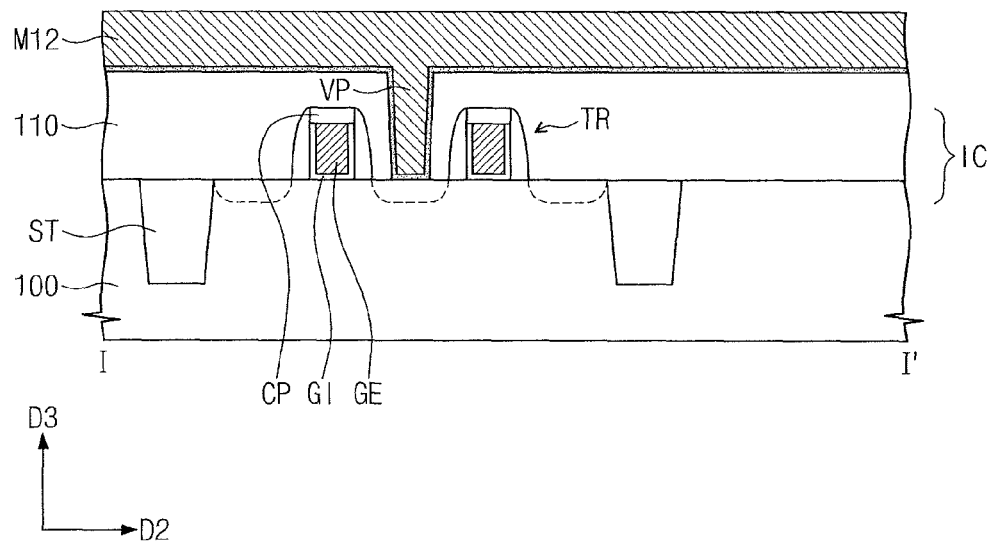
Figure 8B:
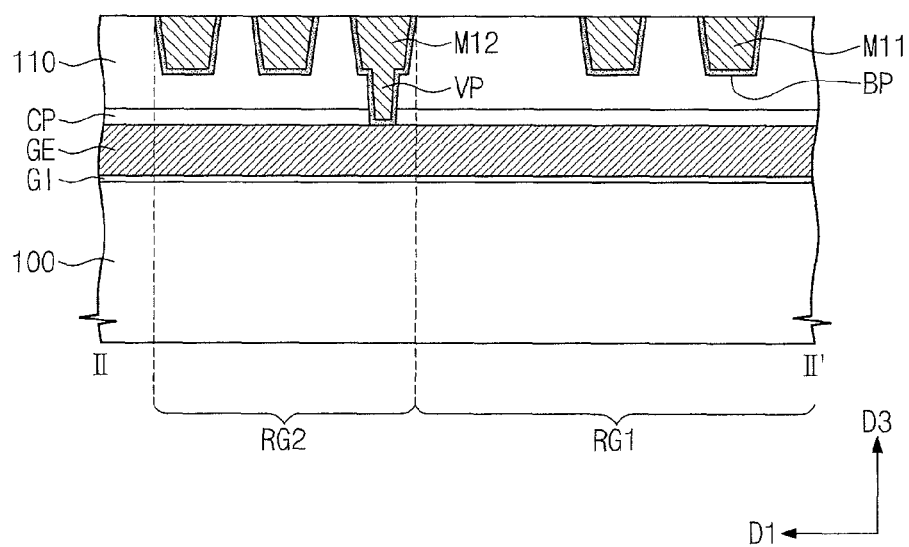

Referring to FIG. 7, FIG. 8A, and FIG. 8B, first and second lower interconnections M11 and M12 may be formed to fill the first and second lower interconnection grooves H11 and H12, respectively (e.g., with a dual damascene process). In some embodiments, a barrier layer may be formed on the first insulating layer 110 and inner surfaces of the lower interconnection grooves H11 and H12. The barrier layer may partially fill the lower interconnection grooves H11 and H12. For example, the barrier layer may include Titanium (Ti), Titanium Nitride (TiN), or a combination thereof. In one embodiment, the barrier layer is deposited with an Atomic Layer Deposition process and is the same as the barrier pattern BP shown in FIG. 3A to FIG. 4B.

Subsequently, a conductive layer may be formed on the barrier layer. The conductive layer may completely fill the lower interconnection grooves H11 and H12. The conductive layer may be formed of a metal such as Copper (Cu) and Tungsten (W). In some embodiments, the conductive layer may be formed by a plating process. In this case, a seed layer (not shown) may be formed on the barrier layer. The conductive layer may be formed by the plating process using the seed layer as a seed.

The conductive layer and the barrier layer may be planarized (e.g, with Chemical Mechanical Polishing), to form the lower interconnections M11 and M12 and barrier patterns BP in the lower interconnection grooves H11 and H12, respectively. Thus, top surfaces of the lower interconnections M11 and M12 may be substantially coplanar with a top surface of the first insulating layer 110, as shown in FIG. 8B.

Figure 9:
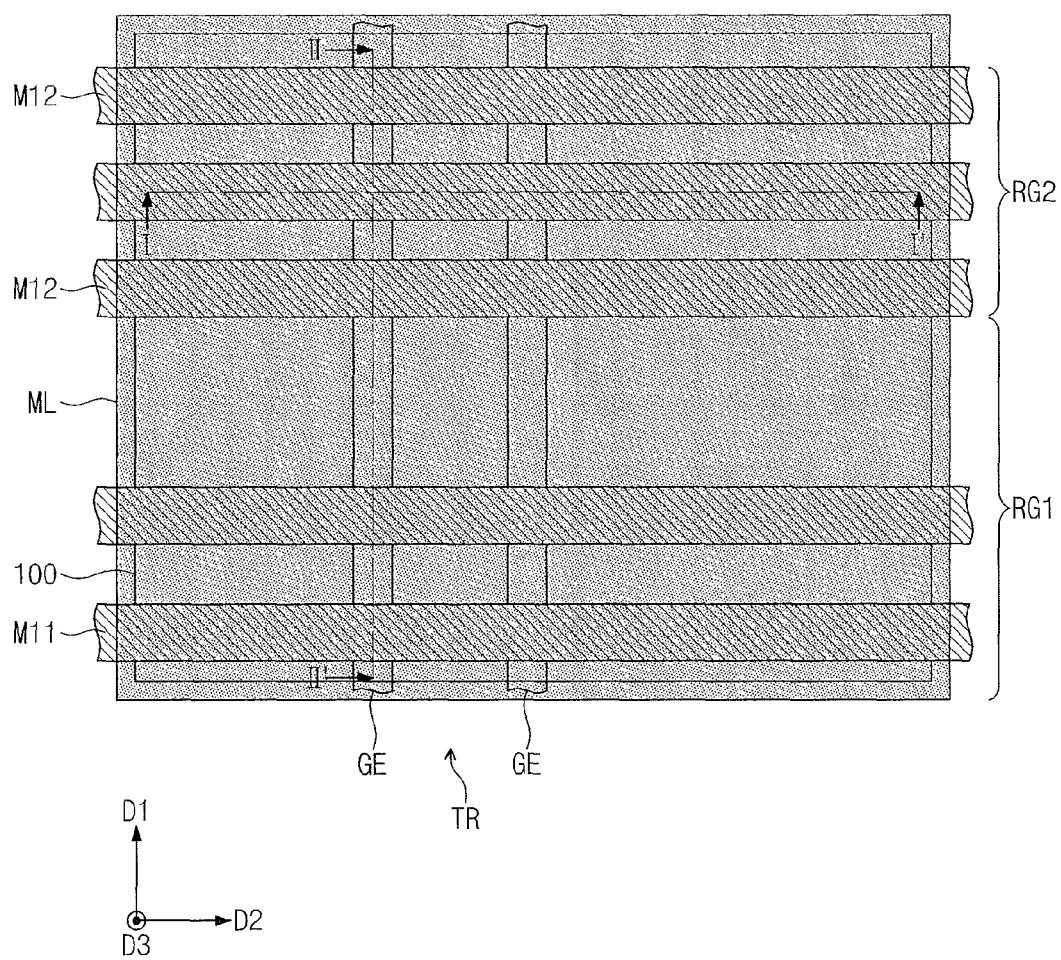
FIG. 9, FIG. 10A and FIG. 10B are a plan view, a cross-sectional view taken along lines I-I' of FIG. 9, and a cross-sectional view taken along II-II' of FIG. 9 respectively, illustrating the subsequent processing of the embodiment of FIG. 7.
Figure 10A:
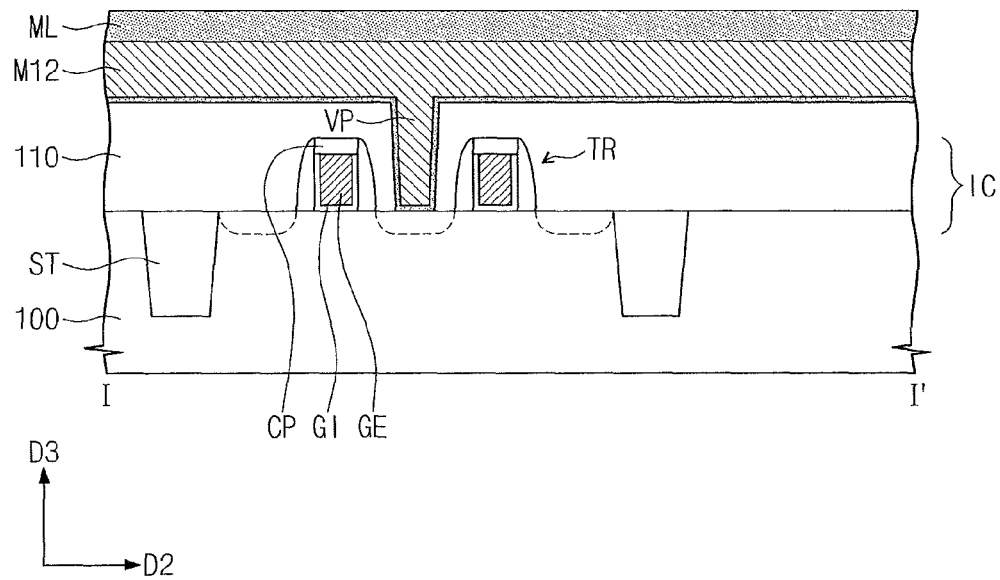
Figure 10B:
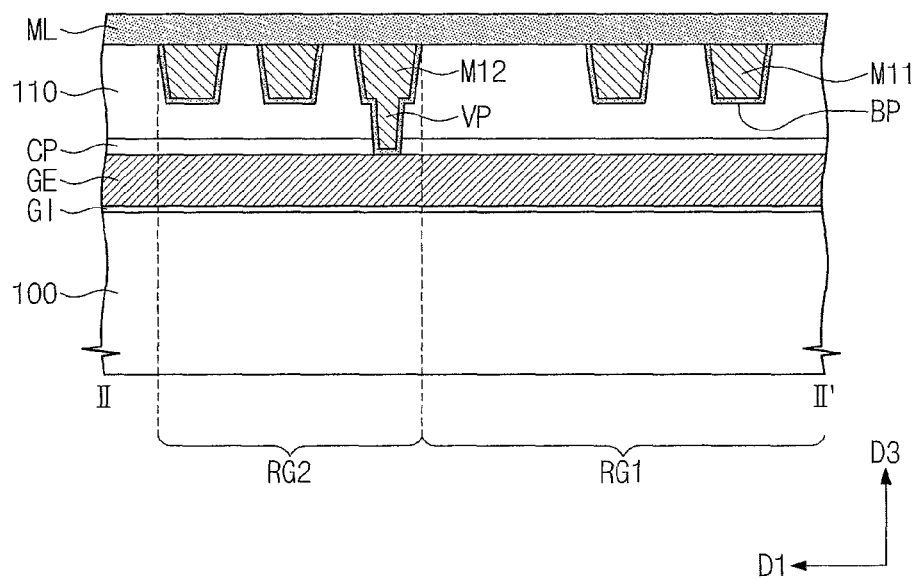

Referring to FIG. 9, FIG. 10A, and FIG. 10B, a first mask layer ML may be formed on the first insulating layer 110. The first mask layer ML may directly cover the lower interconnections M11 and M12. For example, the first mask layer ML may be formed of a Silicon Nitride layer.

Figure 11:
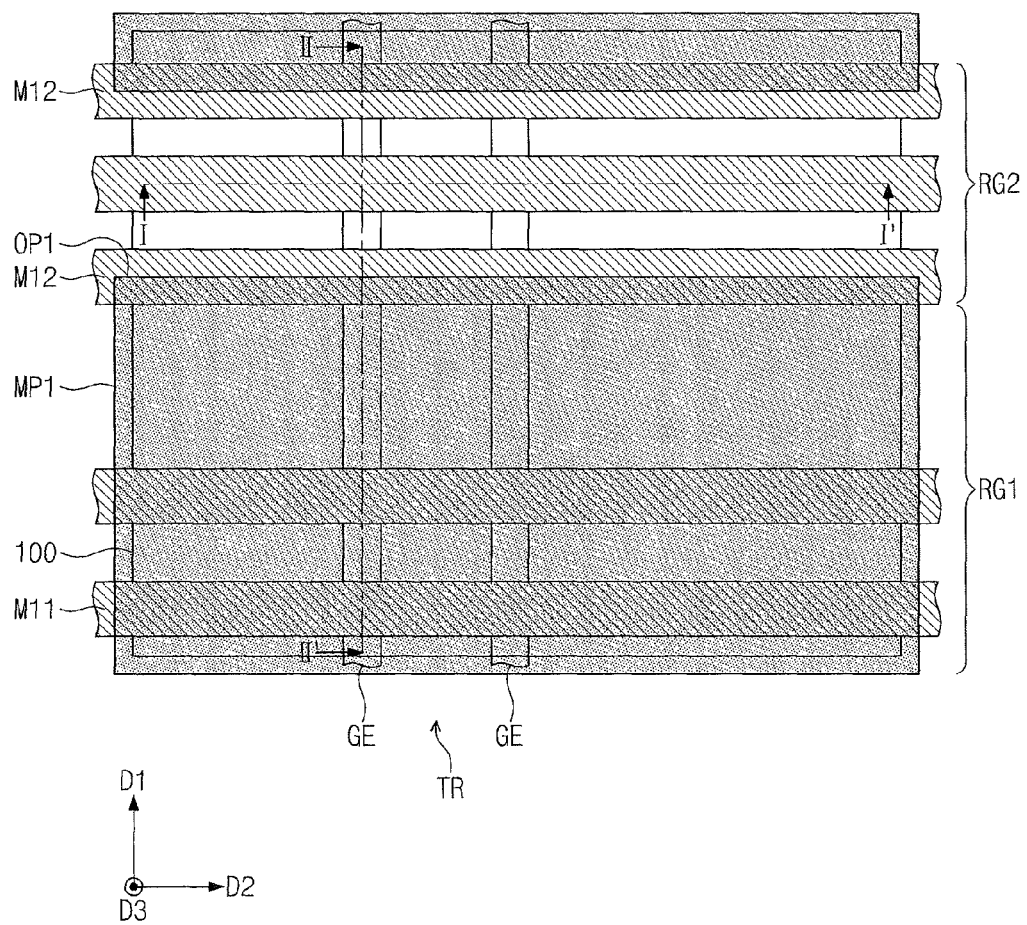
FIG. 11, FIG. 12A and FIG. 12B are a plan view, a cross-sectional view taken along lines I-I' of FIG. 11, and a cross-sectional view taken along II-II' of FIG. 11 respectively, illustrating the subsequent processing of the embodiment of FIG. 9.
Figure 12A:
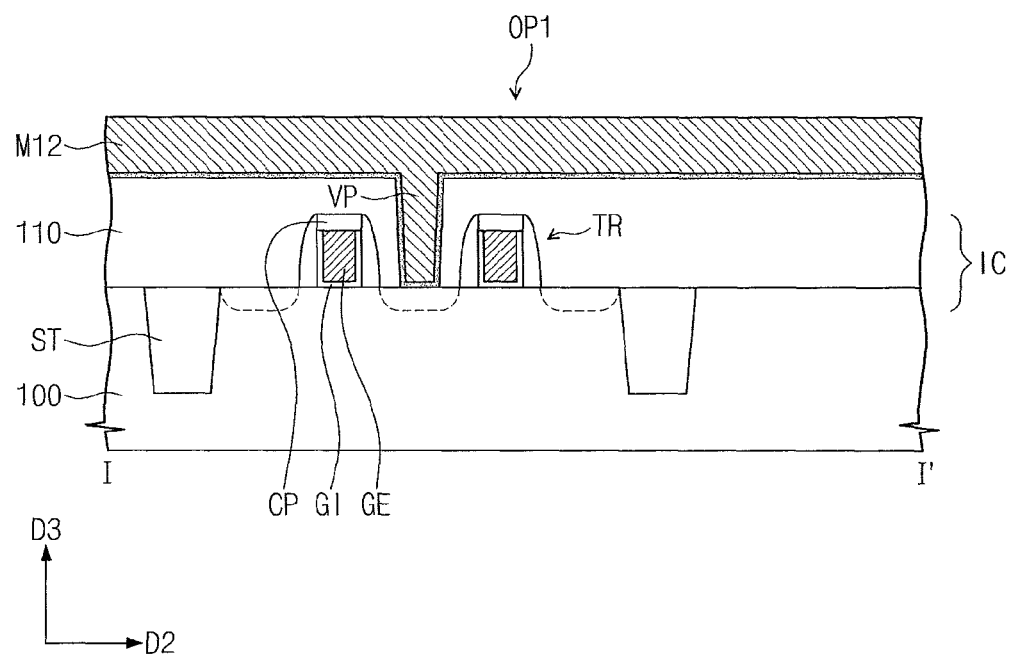
Figure 12B:
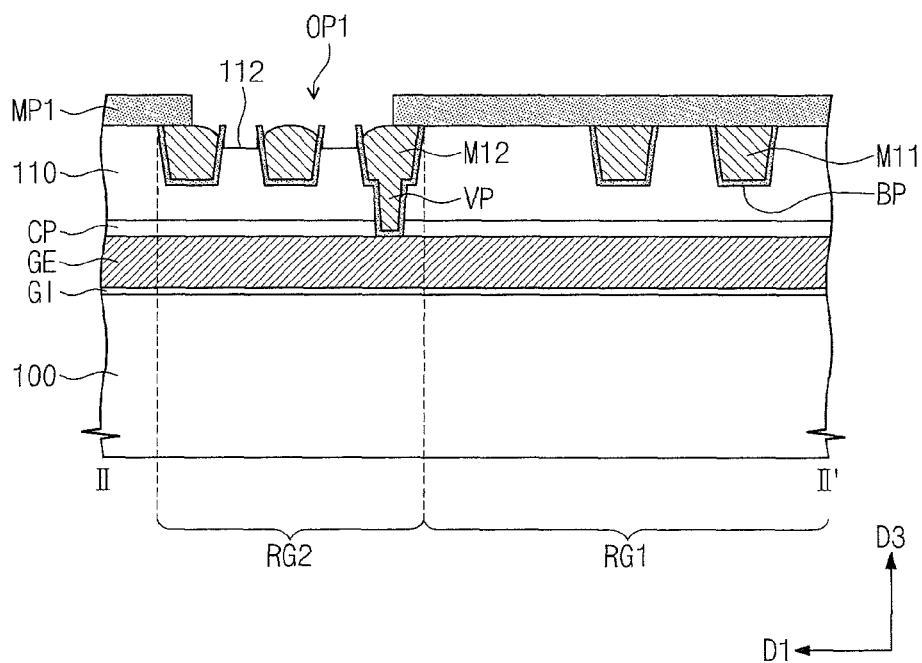

Referring to FIG. 11, FIG. 12A, and FIG. 12B, the first mask layer ML may be patterned to form first mask patterns MP1. The first mask patterns MP1 may be formed to expose the first insulating layer 110 of the second region RG2. In other words, the first mask patterns MP1 may selectively cover the first region RG1. The first mask patterns MP1 may have a first opening OP1 exposing the second region RG2.

The first mask layer ML may be patterned using a dry etching process. A portion of the first mask layer ML, which is disposed on the second region RG2, may be removed using the dry etching process. After the portion of the first mask layer ML disposed on the second region RG2 is removed, over-etching may be performed. Thus, an upper portion of the first insulating layer 110 of the second region RG2 may be recessed by over-etching to form first shallow recess regions 112. The first shallow recess regions 112 may be formed between the second lower interconnections M12.

Conversely, upper portions of the second lower interconnections M12 exposed through the first opening OP1 may be recessed by the over-etching step. Thus, first recesses RS1 may be formed on edges of the second lower interconnections M12, (see FIG. 3A). If the aforementioned planarization of the conductive layer and the barrier layer is incompletely performed, a portion of the conductive layer may remain between the second lower interconnections M12, causing an electrical short. However, the second lower interconnections M12 may be completely insulated from each other by over-etching.

Figure 13:
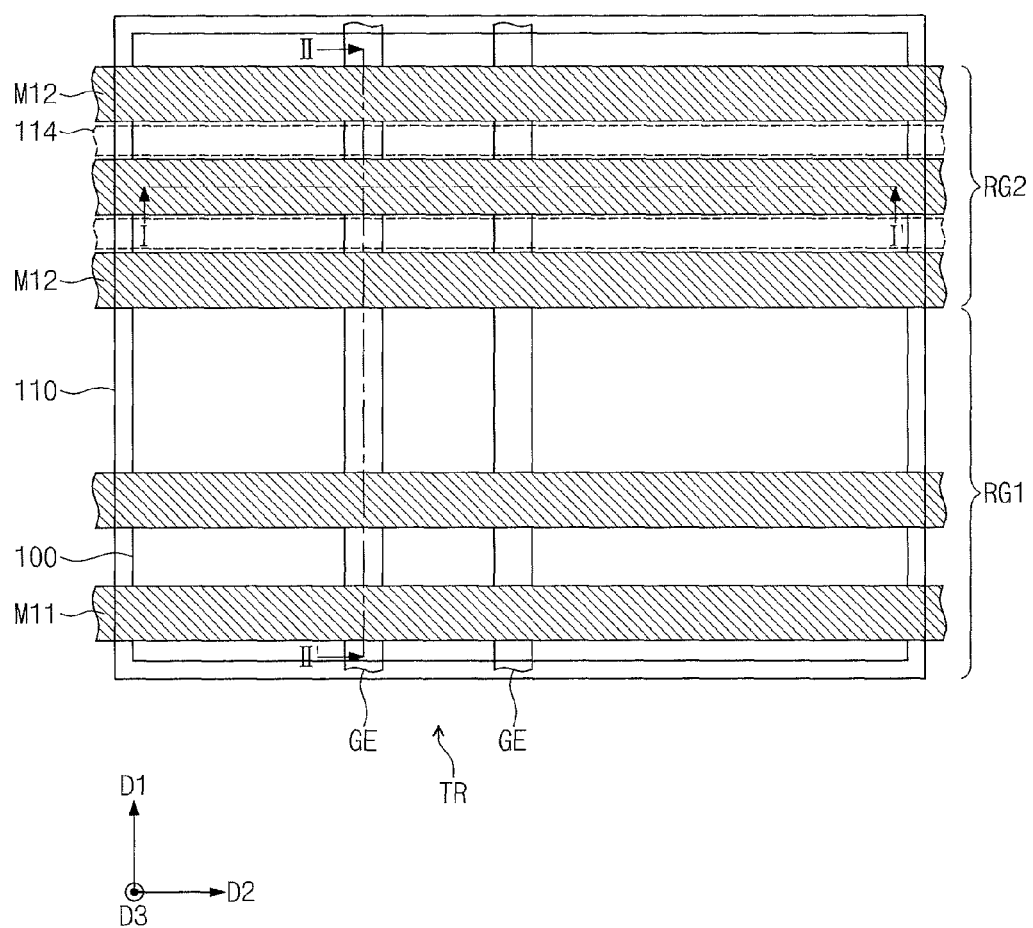
FIG. 13, FIG. 14A and FIG. 14B are a plan view, a cross-sectional view taken along lines I-I' of FIG. 13, and a cross-sectional view taken along II-II' of FIG. 13 respectively, illustrating the subsequent processing of the embodiment of FIG. 11.
Figure 14A:
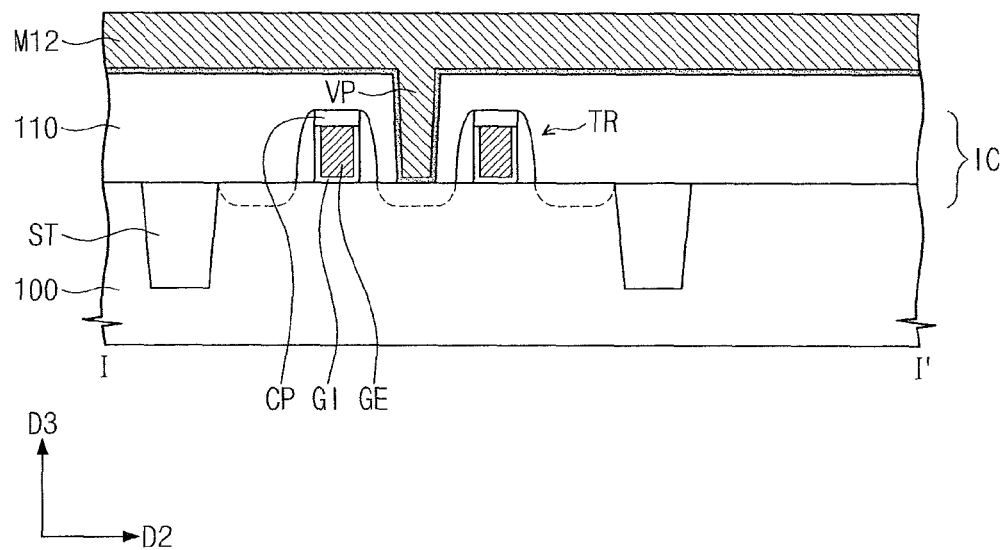
Figure 14B:
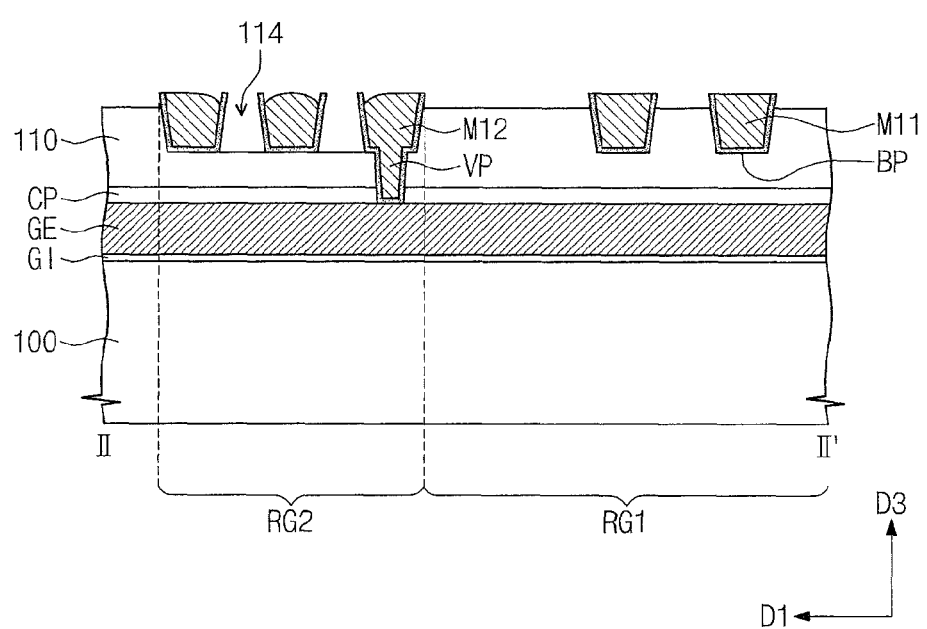

Referring to FIG. 13, FIG. 14A, and FIG. 14B, the first insulating layer 110 of the second region RG2 may be etched using the first mask patterns MP1 as etch masks to form first empty spaces 114 between the second lower interconnections M12. In some embodiments, etching the first insulating layer 110 may be performed by a wet etching process using Hydrofluoric (HF) acid. The first empty spaces 114 may extend along the second lower interconnections M12 in the second direction D2. The first empty spaces 114 may expose sidewalls of the barrier patterns BP. In other embodiments, other isotropic etch methods are used to etch the first shallow recess regions 112 to form the empty spaces 114.

In addition, the first mask patterns MP1 may be completely removed during the wet etching process. Subsequently, an upper portion of the first insulating layer 110 of the first region RG1 may be exposed and then may be recessed by over-etching. Thus, a top surface of the first insulating layer 110 of the first region RG1 may be lower than top surfaces of the first lower interconnections M11, (see FIG. 3B).

In addition, the exposed lower interconnections M11 and M12 may be slightly recessed during the wet etching process, thereby forming second recesses RS2 on edges of the lower interconnections M11 and M12 (See FIG. 4A and FIG. 4B). Like the first recesses RS1 described above, the lower interconnections M11 and M12 may be completely insulated from each other by the second recesses RS2, shown in FIG. 4A and FIG. 4B.

Figure 15:
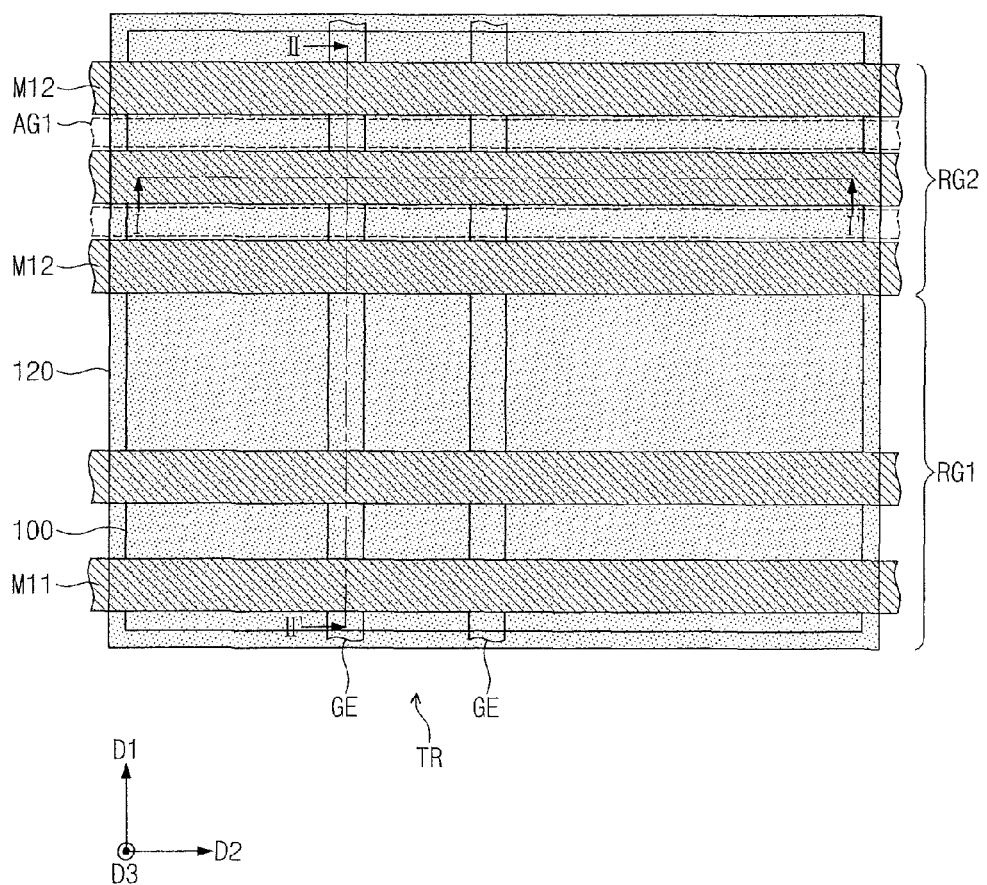
FIG. 15, FIG. 16A and FIG. 16B are a plan view, a cross-sectional view taken along lines I-I' of FIG. 15, and a cross-sectional view taken along II-II' of FIG. 15 respectively, illustrating the subsequent processing of the embodiment of FIG. 13.
Figure 16A:
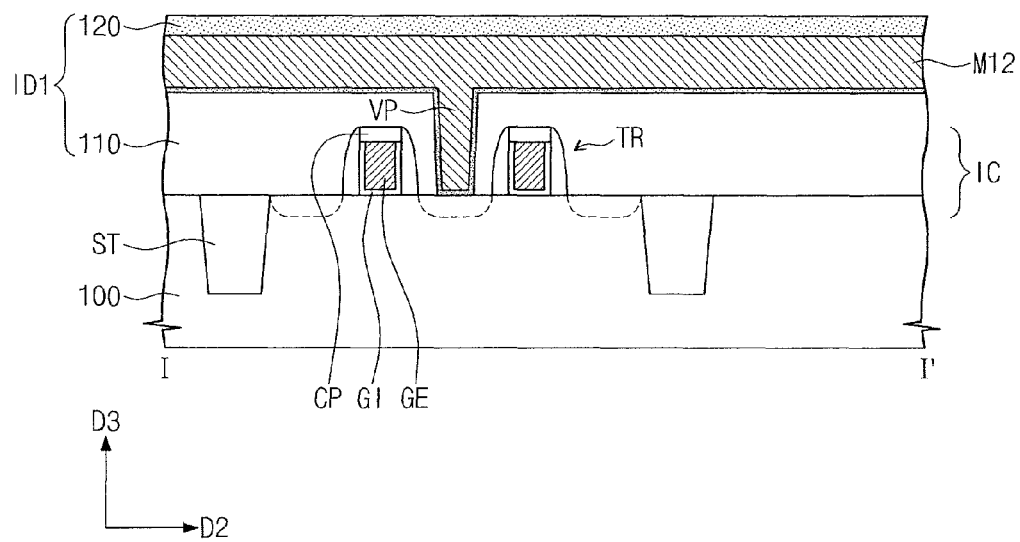
Figure 16B:
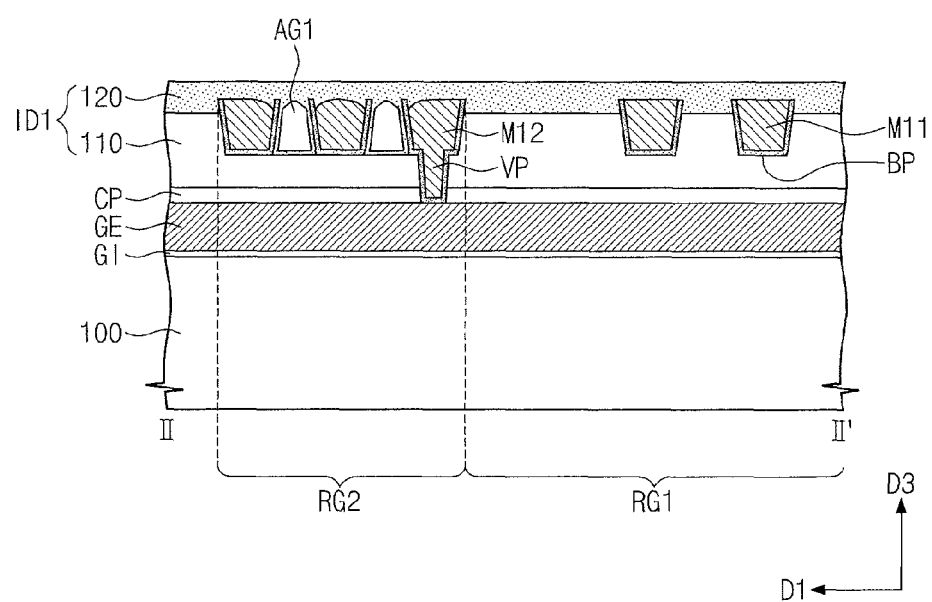

Referring to FIG. 15, FIG. 16A, and FIG. 16B, a second insulating layer 120 may be formed on the first insulating layer 110 and the lower interconnections M11 and M12. The first and second insulating layers 110 and 120 may constitute a first interlayer insulating layer ID1. For example, the second insulating layer 120 may be formed of a Silicon Nitride layer or a Silicon Carbonitride (SiCN) layer.

The second insulating layer 120 may be formed using a deposition process having poor step coverage, (e.g., a Chemical Vapor Deposition (CVD) process or a Physical Vapor Deposition (PVD) process). The second insulating layer 120 may partially fill the first empty spaces 114 during the deposition process. Here, the first empty spaces 114 may be capped by the second insulating layer 120 deposited on the second lower interconnections M12 before the second insulating layer 120 completely fills the first empty spaces 114. Thus, first air gaps AG1 surrounded by the second insulating layer 120 may be formed from the first empty spaces 114. A thickness of the second insulating layer 120 surrounding the first air gap AG2 may vary according to a position by the deposition process having the poor step coverage property, (see FIG. 3A).

Figure 23:
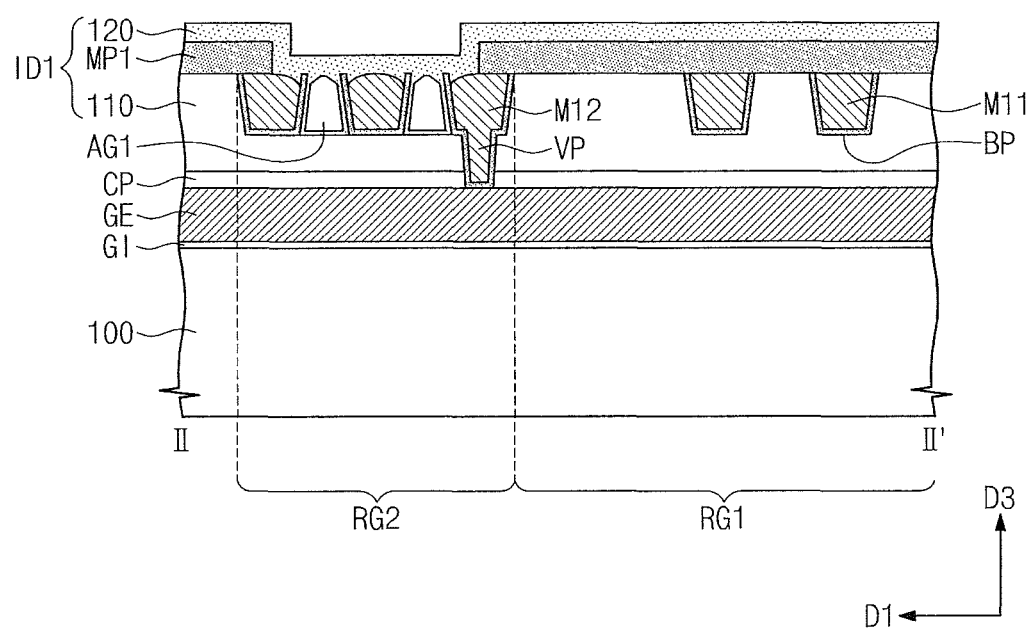
FIG. 23 is a cross-sectional view taken along line I-I' of FIG. 15 to illustrate a step in the manufacturing of a semiconductor device, according to a comparative example.

FIG. 23 is a cross-sectional view corresponding taken along line I-I' of FIG. 15 to illustrate a method of manufacturing a semiconductor device, according to a comparative example. Referring to FIG. 23, in some embodiments, the first mask patterns MP1 may remain after the wet etching process described with reference to FIG. 13, FIG. 14A, and FIG. 14B. In this case, the first mask patterns MP1 may include Silicon Carbonitride (SiCN). Next, the second insulating layer 120 described with reference to FIG. 15, FIG. 16A, and FIG. 16B may be formed to form the first air gaps AG1, by capping the empty spaces 114 with the second insulating layer 120.

Due to the first mask patterns MP1, a height difference may occur between the second insulating layer 120 of the first region RG1 and the second insulating layer 120 of the second region RG2. The height difference may cause defects during formation of upper interconnections M21 and M22 and a second interlayer insulating layer ID2 to be described below. Thus in one embodiment, an additional etching process for selectively removing the first mask patterns MP1 should be performed before the formation of the second insulating layer 120. In another embodiment, a planarization process is performed on the second insulating layer 120 after the formation of the second insulating layer 120. As a result, this may reduce efficiency (e.g. cost) of processes of manufacturing a semiconductor device, as well as increase the probability of introducing defects in the process by adding additional steps.

However, according to some embodiments of the inventive concepts, a top surface of the second insulating layer 120 of the first region RG1 may be substantially coplanar with a top surface of the second insulating layer 120 of the second region RG2, as illustrated in FIG. 15, FIG. 16A, and FIG. 16B. Thus, embodiments of the inventive concepts that include removal of the mask MP1 (see FIG. 13) do not require an additional process. Accordingly, the efficiency of processes of manufacturing the semiconductor device may be improved.

Figure 17:
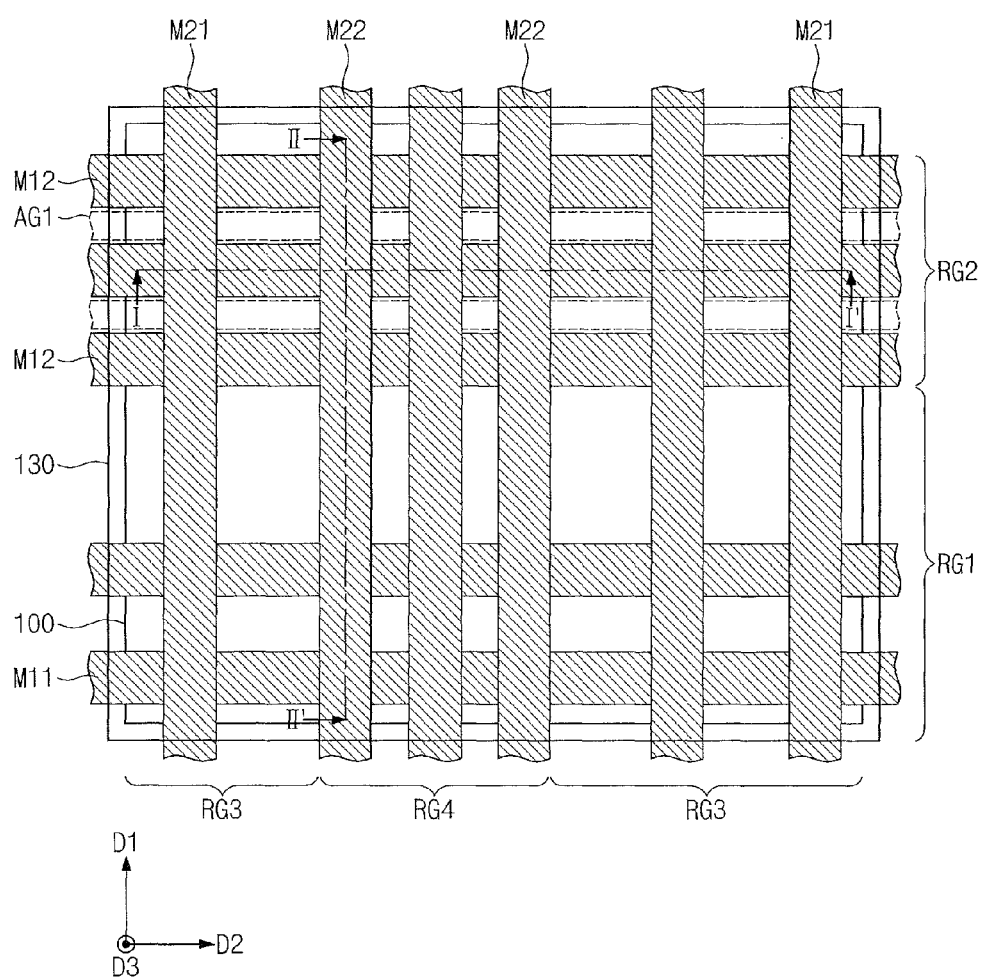
FIG. 17, FIG. 18A and FIG. 18B are a plan view, a cross-sectional view taken along lines I-I' of FIG. 17, and a cross-sectional view taken along II-II' of FIG. 17 respectively, illustrating the subsequent processing of the embodiment of FIG. 15.
Figure 18A:
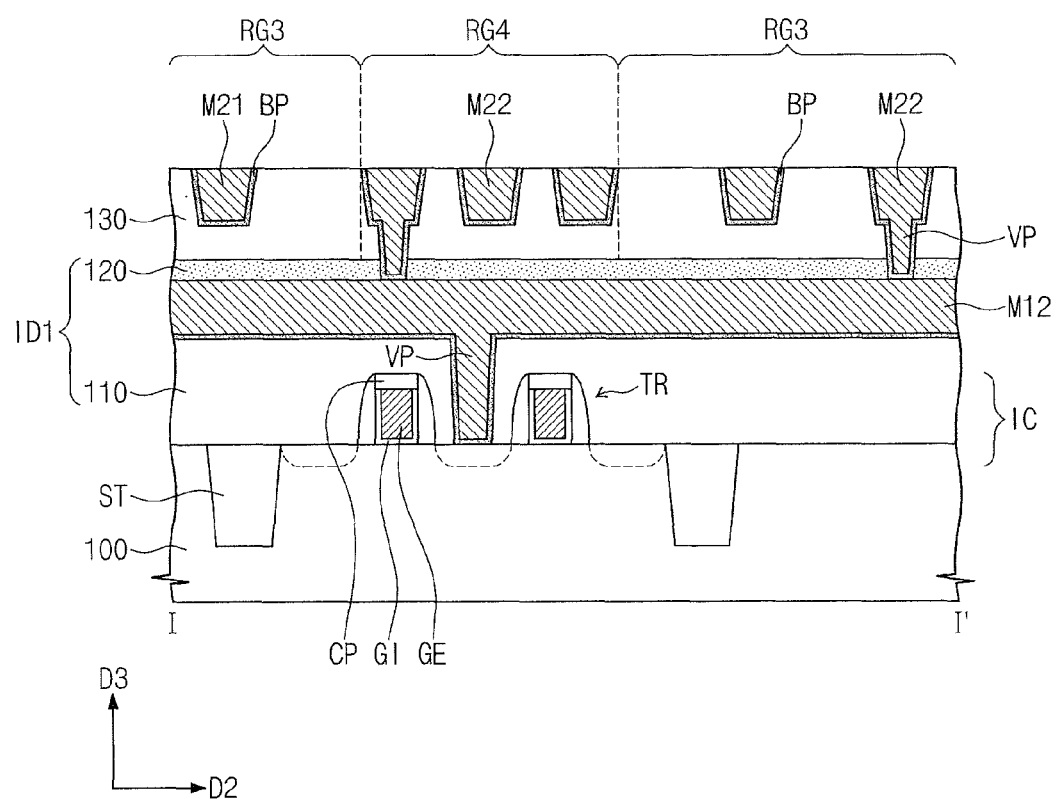
Figure 18B:
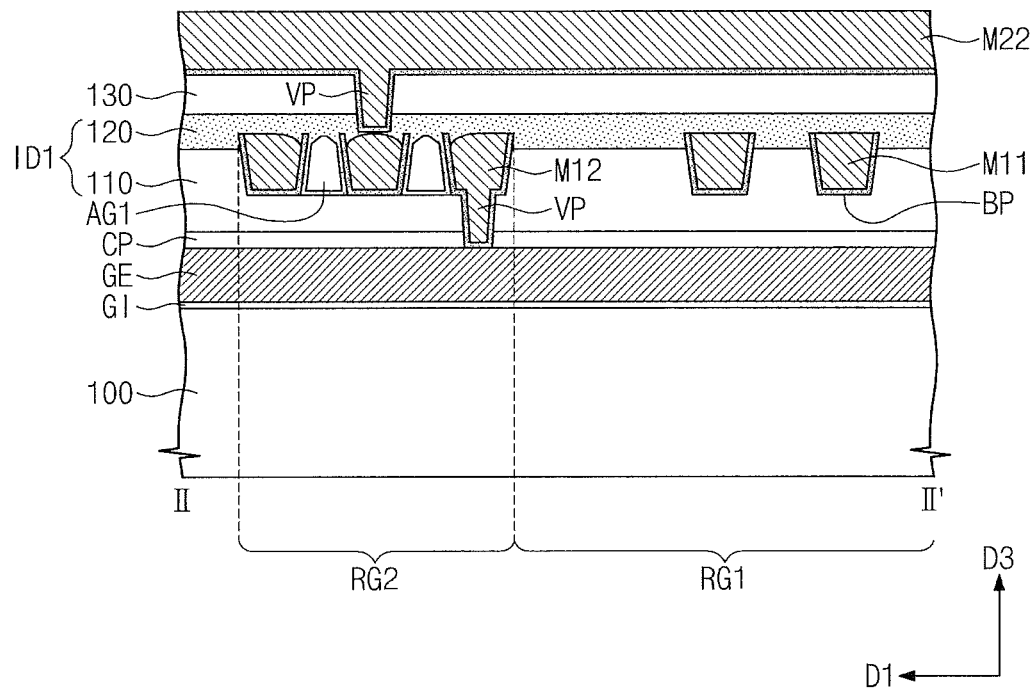

Referring to FIG. 17, FIG. 18A, and FIG. 18B, a third insulating layer 130 may be fruited on the second insulating layer 120. The third insulating layer 130 may include a third region RG3 and a fourth region RG4. For example, the third insulating layer 130 may include a Silicon Oxide layer.

Upper interconnections M21 and M22 extending in the first direction D1 intersecting the second direction D2 may be formed in the third insulating layer 130. The upper interconnections M21 and M22 may include first upper interconnections M21 formed in the third region RG3 and second upper interconnections M22 Ruined in the fourth region RG4. A method of forming the upper interconnections M21 and M22 may be the same or similar as the method of forming the lower interconnections M11 and M12 described with reference to FIG. 5, FIG. 6A, FIG. 6B, FIG. 7, FIG. 8A, and FIG. 8B.

Figure 19:
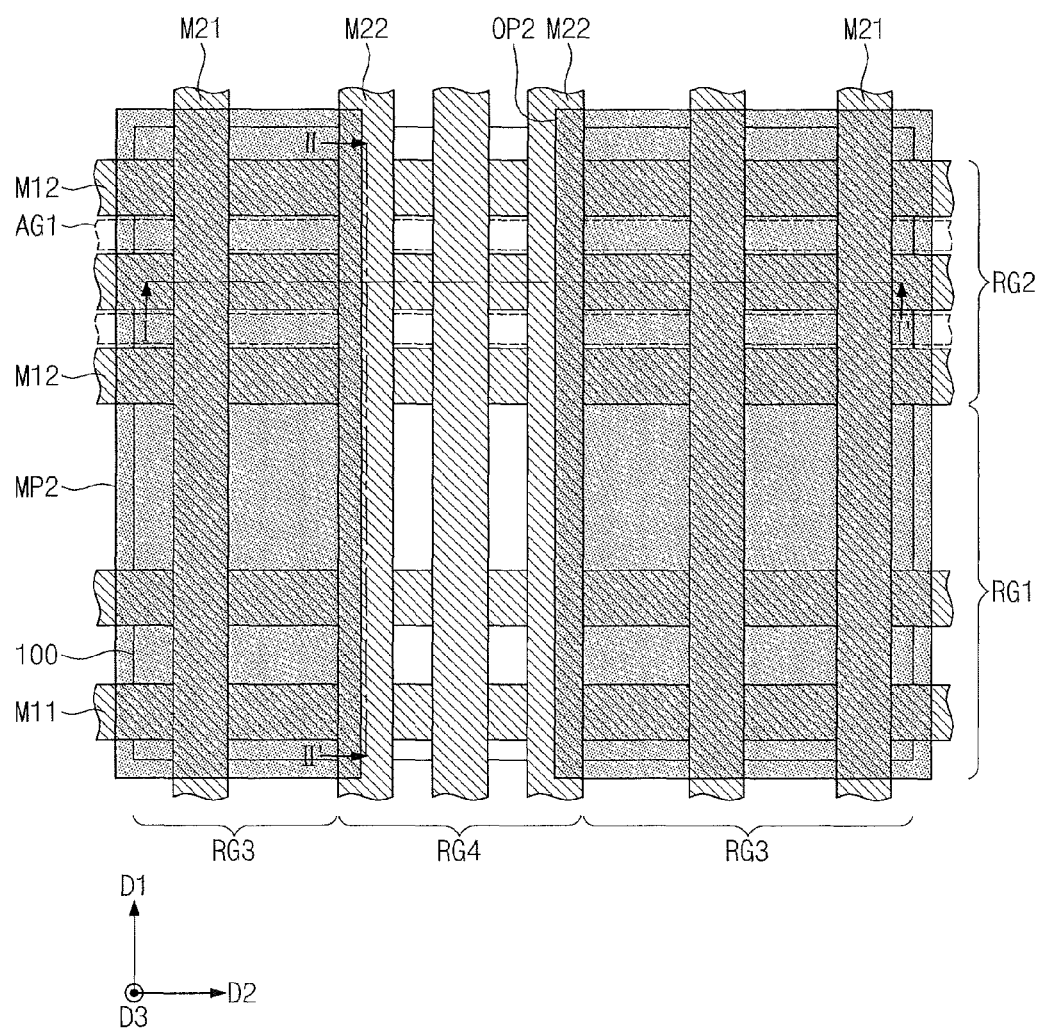
FIG. 19, FIG. 20A and FIG. 20B are a plan view, a cross-sectional view taken along lines I-I' of FIG. 19, and a cross-sectional view taken along II-II' of FIG. 19 respectively, illustrating the subsequent processing of the embodiment of FIG. 17.
Figure 20A:
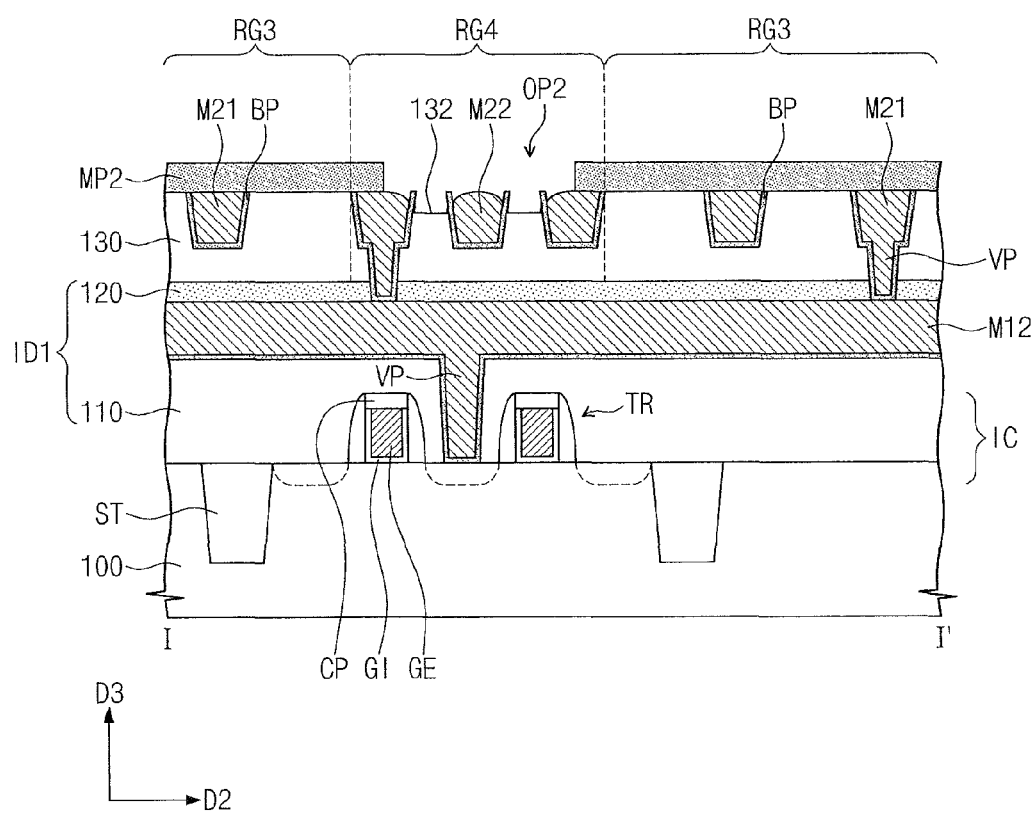
Figure 20B:
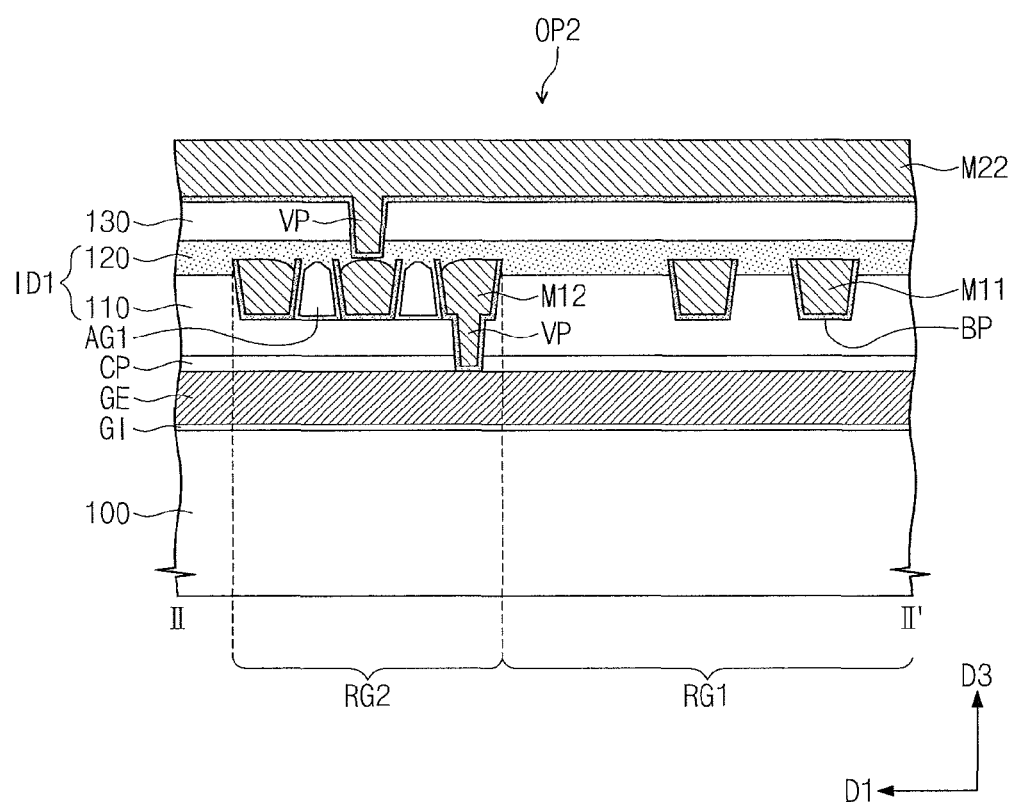

Referring to FIG. 19, FIG. 20A, and FIG. 20B, second mask patterns MP2 may be formed on the third insulating layer 130. The second mask patterns MP2 may be formed to expose the third insulating layer 130 of the fourth region RG4. Specifically, the second mask patterns MP2 may selectively cover the third region RG3. The second mask patterns MP2 may have a second opening OP2 exposing the fourth region RG4. Forming the second mask patterns MP2 may include forming a second mask layer on the third insulating layer 130 and patterning the second mask layer.

The second mask patterns MP2 may be formed by the same or similar method as described above with reference to FIG. 11, FIG. 12A, and FIG. 12B. Thus, an upper portion of the third insulating layer 130 of the fourth region RG4 may be recessed to form second shallow recess regions 132. The second shallow recess regions 132 may be formed between the second upper interconnections M22.

Upper portions of the second upper interconnections M22 exposed through the second opening OP2 may be recessed by over-etching. Thus, first recesses RS1 may be formed on edges of the second upper interconnections M22, (see FIG. 3A).

Figure 21:
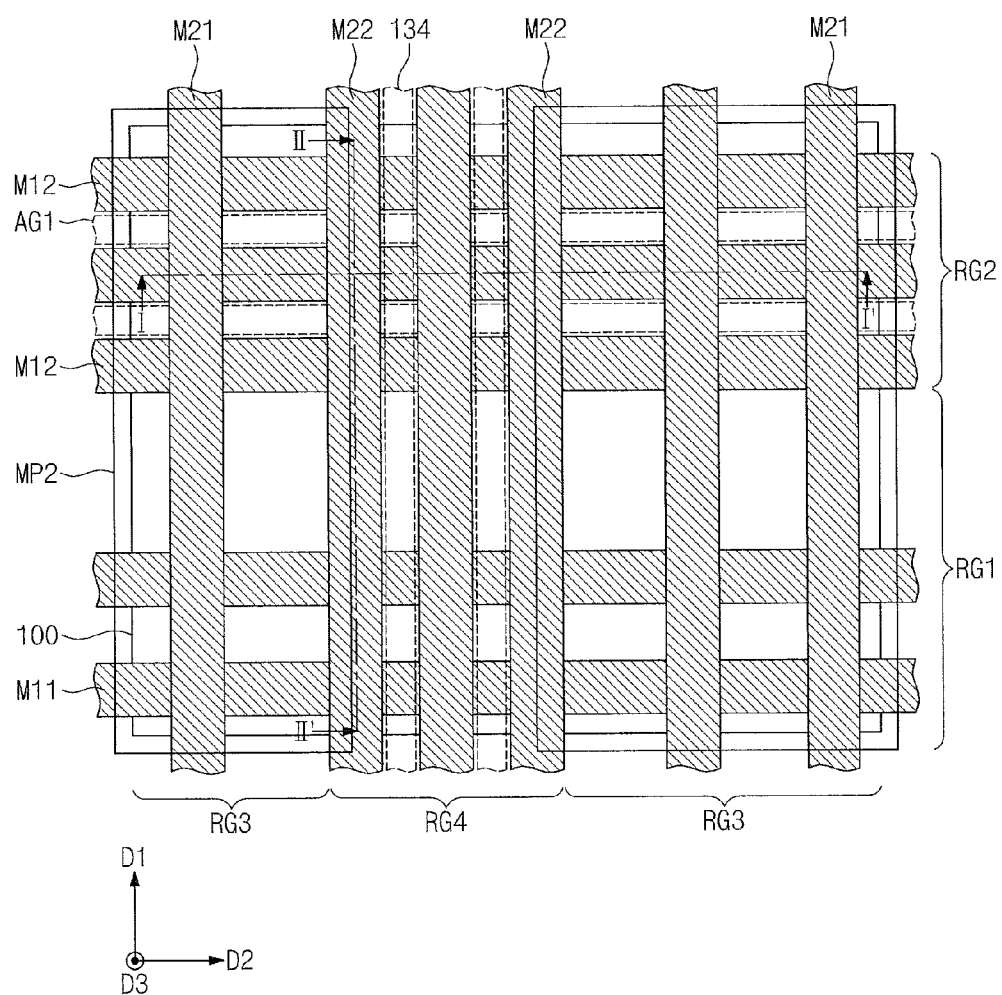
FIG. 21, FIG. 22A and FIG. 22B are a plan view, a cross-sectional view taken along lines I-I' of FIG. 21, and a cross-sectional view taken along II-II' of FIG. 21 respectively, illustrating the subsequent processing of the embodiment of FIG. 19.
Figure 22A:
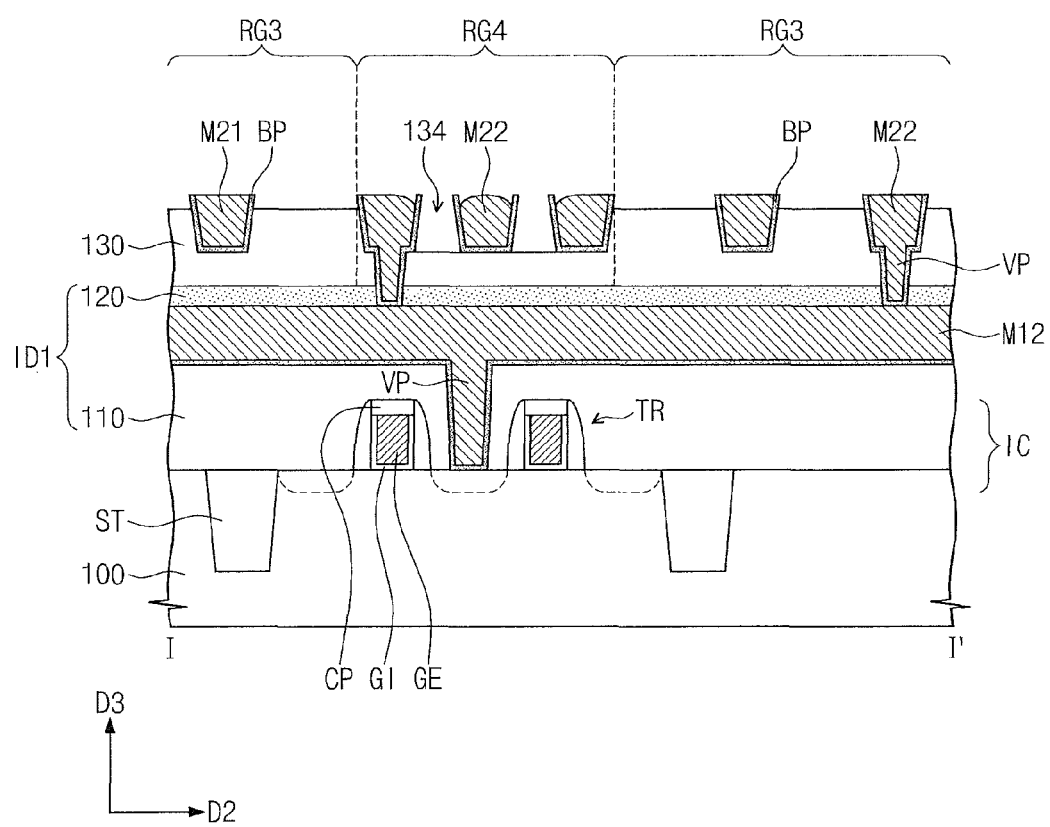
Figure 22B:
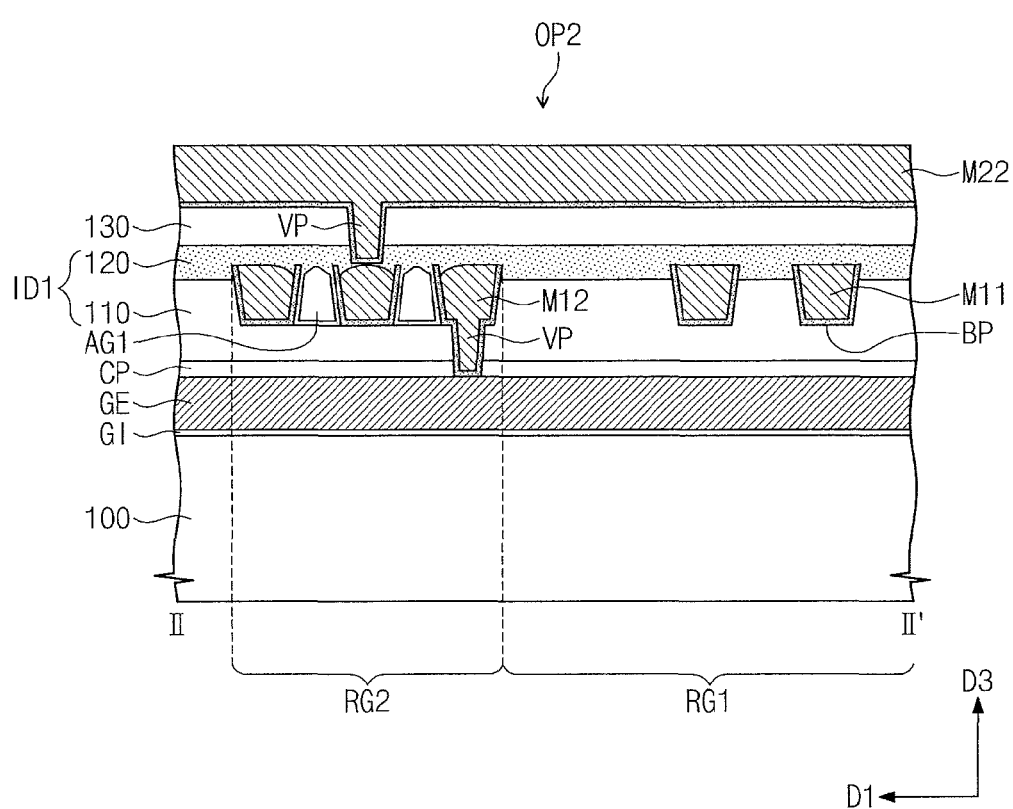

Referring to FIG. 21, FIG. 22A, and FIG. 22B, the third insulating layer 130 of the fourth region RG4 may be etched using the second mask patterns MP2 as etch masks to form second empty spaces 134 between the second upper interconnections M22. The second empty spaces 134 may extend along the second upper interconnections M22 in the first direction D1.

The etching process of forming the second empty spaces 134 may be the same or similar as described with reference to FIG. 13, FIG. 14A, and FIG. 14B. Thus, the second mask patterns MP2 may be completely removed during the etching process. In addition, an upper portion of the third insulating layer 130 of the third region RG3 may be recessed by over-etching. Thus, a top surface 130t of the third insulating layer 130 of the third region RG3 may be lower than top surfaces M21t of the first upper interconnections M21, (see FIG. 3B).

Furthermore, exposed upper interconnections M21 and M22 may be slightly recessed during the etching process, thereby forming second recesses RS2 on edges of the upper interconnections M21 and M22, (see FIG. 4A and FIG. 4B).

Referring again to FIG. 1, FIG. 2A, and FIG. 2B, a fourth insulating layer 140 may be formed on the third insulating layer 130 and the upper interconnections M21 and M22. The third and fourth insulating layers 130 and 140 respectively may constitute a second interlayer insulating layer ID2. For example, the fourth insulating layer 140 may be formed of a Silicon Nitride layer or a Silicon Carbonitride (SiCN) layer.

Similar to the second insulating layer 120 described with reference to FIG. 15, FIG. 16A, and FIG. 16B, the fourth insulating layer 140 may be formed using a deposition process having poor step coverage. Thus, second air gaps AG2 surrounded by the fourth insulating layer 140 may be formed from the second empty spaces 134. A thickness of the fourth insulating layer 140 surrounding the second air gap AG2 may be varied according to a position by the deposition process having the poor step coverage property, (see FIG. 3A). Conversely, a top surface of the fourth insulating layer 140 of the third region RG3 may be substantially coplanar with a top surface of the fourth insulating layer 140 of the fourth region RG4.

Figure 24:
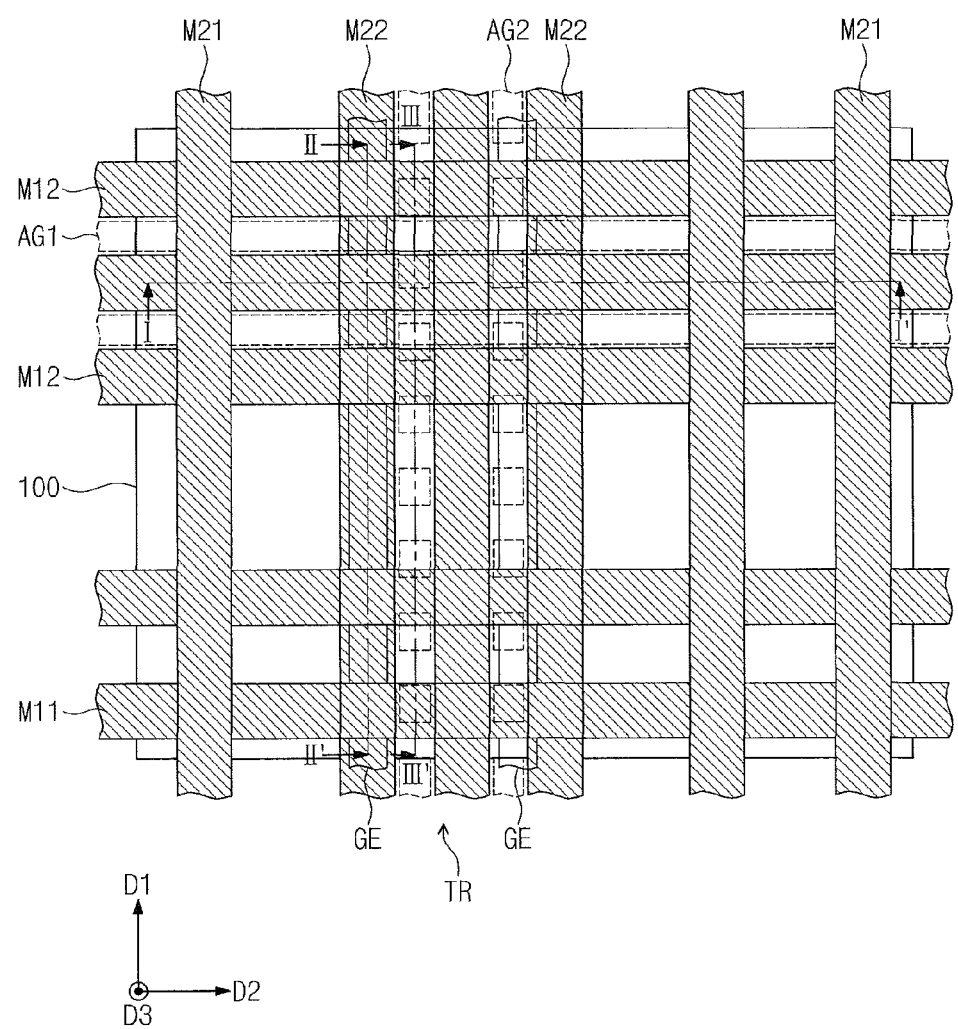
FIG. 24 is a plan view illustrating an embodiment of a semiconductor device according to the inventive concepts.
Figure 25:
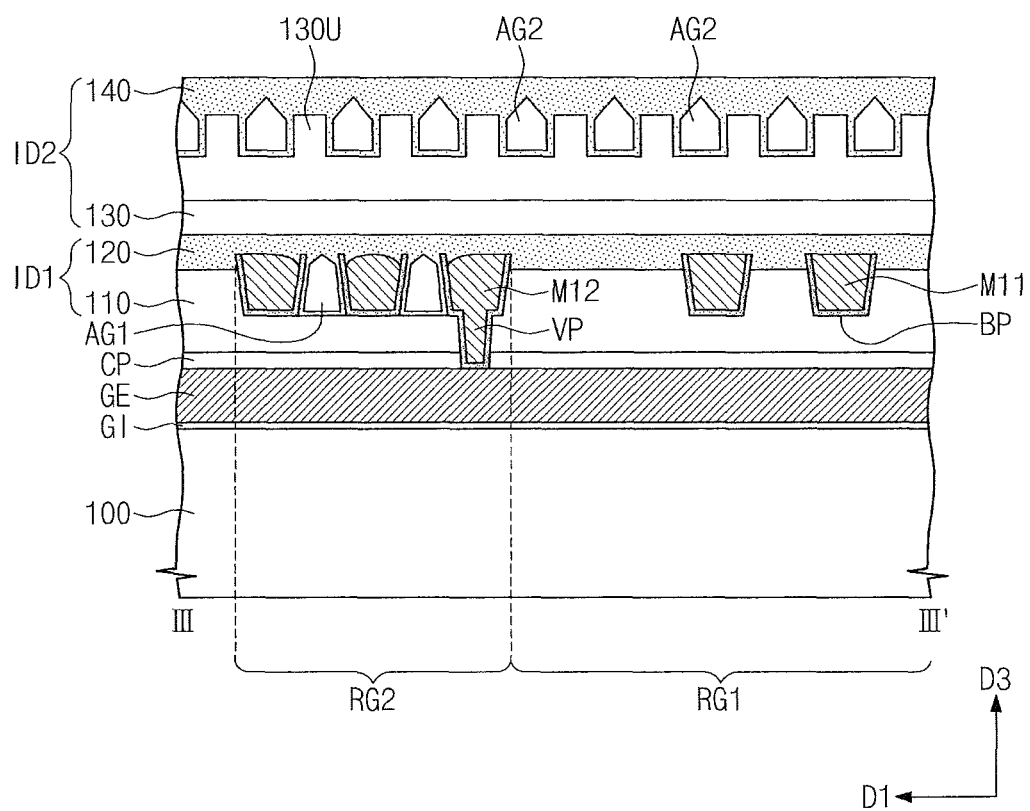
FIG. 25 is a cross-sectional view taken along a line III-III' of FIG. 24.

FIG. 24 is a plan view illustrating an embodiment of a semiconductor device according to the inventive concepts. FIG. 25 is a cross-sectional view taken along a line of FIG. 24. A cross-sectional view taken along a line I-I' of FIG. 24 may be the same as shown in FIG. 2A, and a cross-sectional view taken along a line II-II' of FIG. 24 may be the same as shown in FIG. 2B. In the present embodiment, the descriptions of the same technical features as in the embodiments of FIG. 1, FIG. 2A, FIG. 2B, FIG. 3A, and FIG. 3B will be omitted or mentioned briefly for brevity and clarity of explanation. Instead, differences between the present embodiment and the embodiments of FIG. 1, FIG. 2A, FIG. 2B, FIG. 3A, and FIG. 3B will be described.

Referring to FIG. 24, FIG. 25, FIG. 2A, and FIG. 2B, a plurality of second air gaps AG2 may be provided between a pair of second upper interconnections M22 adjacent to each other. Specifically, the second air gaps AG2 may be spaced apart from each other and may be arranged in a first direction D1, unlike the second air gap AG2 having the linear shape described with reference to FIG. 1, FIG. 2A, and FIG. 2B. A third insulating layer 130 may include protruding portions 130U disposed between the pair of second upper interconnections M22. Each of the protruding portions 130U may be disposed between the second air gaps AG2 adjacent to each other in the first direction D1. Structural stability of the second air gaps AG2 may be improved by the protruding portions 130U and a fourth insulating layer 140, which fill spaces between the second air gaps AG2 and the protruding portions 130U.

In the present embodiment, the plurality of second air gaps AG2 disposed between the pair of second upper interconnections M22 are described as an example. Similarly, a plurality of first air gaps AG1 may be arranged between a pair of first lower interconnections M11 adjacent to each other. However, embodiments of the inventive concepts are not limited thereto.

Figure 26:
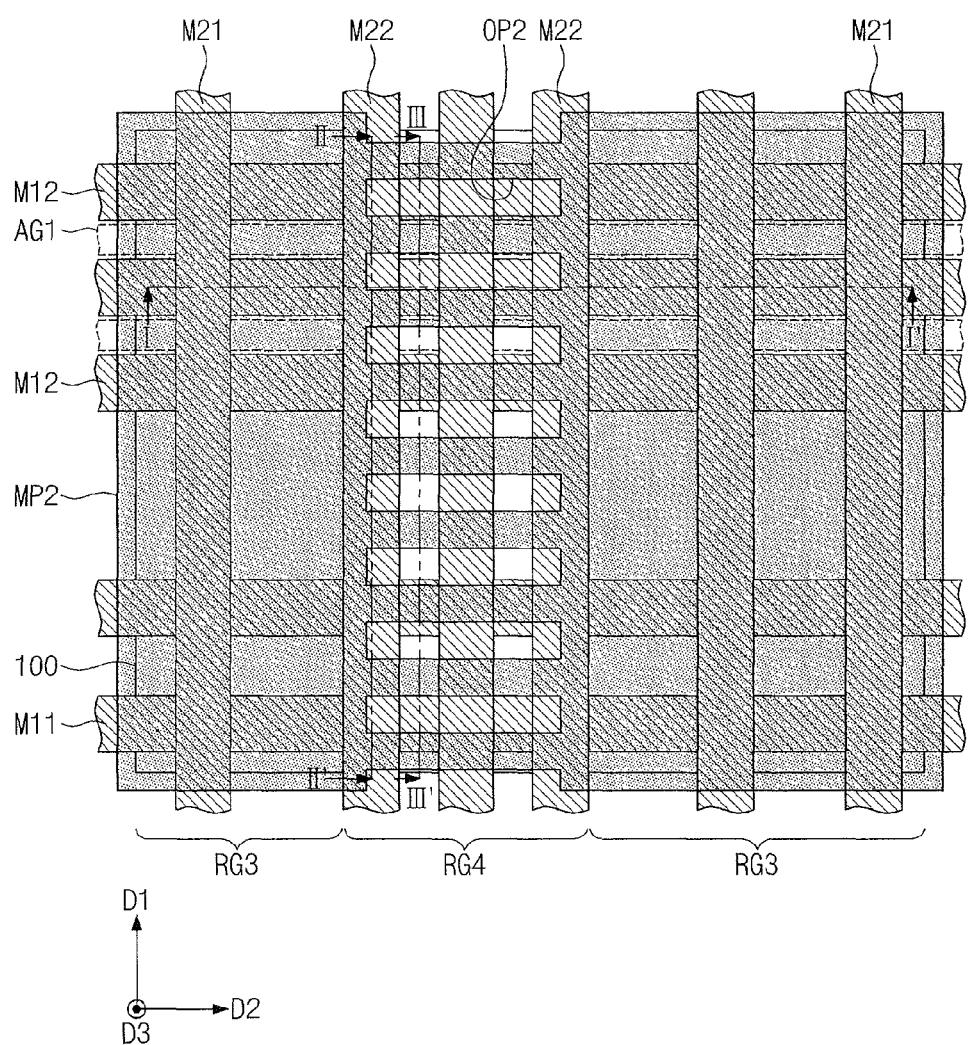
FIG. 26 is a plan view illustrating a step in the manufacturing of a semiconductor device, according to some embodiments of the inventive concepts.
Figure 27:
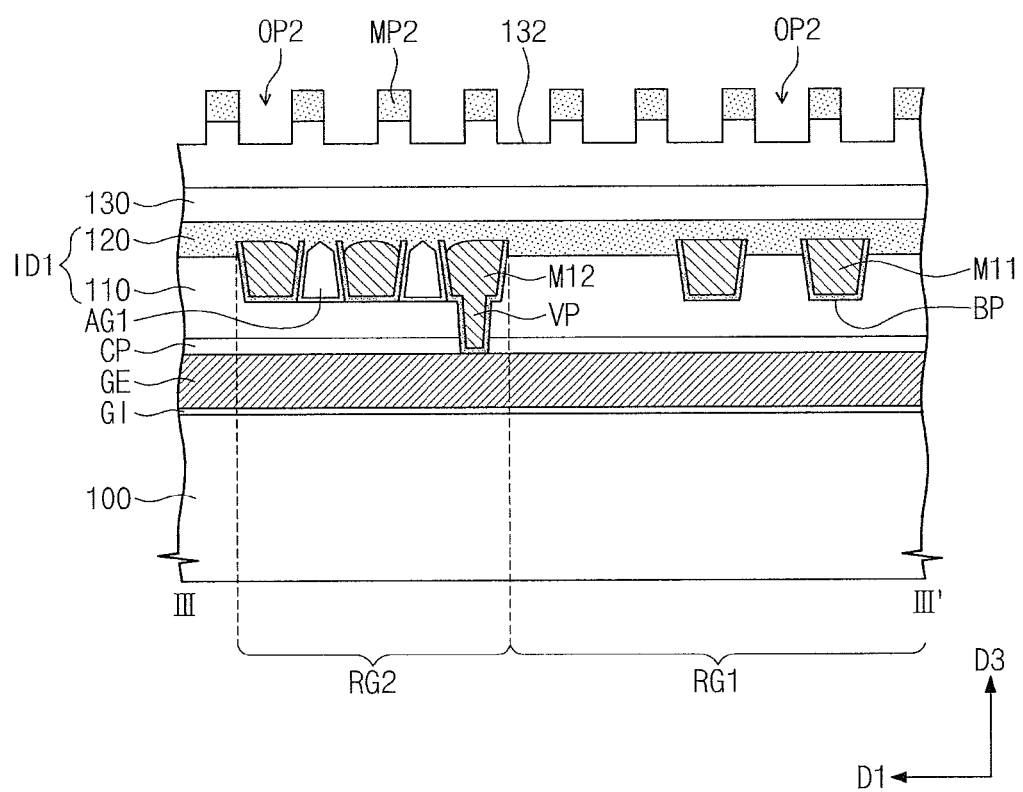
FIG. 27 is a cross-sectional view taken along a line of FIG. 26.

FIG. 26 is a plan view illustrating a step in the manufacturing of a semiconductor device, according to the inventive concepts. FIG. 27 is a cross-sectional view taken along line of FIG. 26. A cross-sectional view taken along line I-I' of FIG. 26 may be the same as shown in FIG. 20A, and a cross-sectional view taken along a line II-II' of FIG. 26 may be the same as shown in FIG. 20B. In the present embodiment, the descriptions of the same technical features as in the manufacturing method of FIGS. 5 to 22B will be omitted or mentioned briefly for brevity and clarity of explanation. Instead, differences between the present embodiment and the embodiment of FIGS. 5 to 22B will be described.

Referring to FIG. 26, FIG. 27, FIG. 20A, and FIG. 20B, a second mask pattern MP2 may be formed on the structure illustrated in FIG. 17, FIG. 18A, and FIG. 18B. The second mask pattern MP2 may be formed to expose portions of a third insulating layer 130 of a fourth region RG4. Specifically, the second mask pattern MP2 may have a plurality of second openings OP2 exposing portions of the fourth region RG4. The second openings OP2 may be arranged along a first direction D1 when viewed from a plan view.

Thus, second shallow recess regions 132 may be formed on the third insulating layer 130 exposed by the second openings OP2. The second shallow recess regions 132 may be arranged along the first direction D1 between the second upper interconnections M22.

Referring again to FIG. 24, FIG. 25, FIG. 2A, and FIG. 2B, the third insulating layer 130 may be etched using the second mask pattern MP2 as an etch mask, and then a fourth insulating layer 140 may be formed on the third insulating layer 130. Concurrently, second air gaps AG2 surrounded by the fourth insulating layer 140 may be formed.

Figure 28:
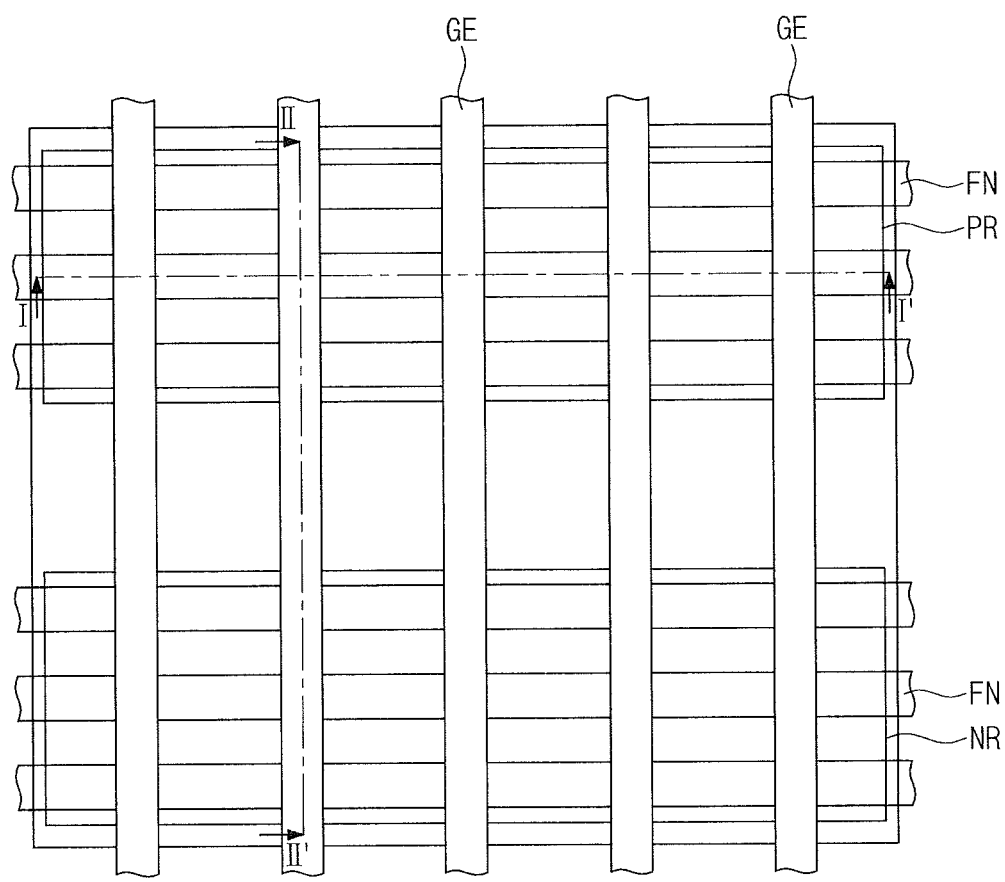
FIG. 28 is a plan view illustrating an embodiment of a semiconductor device according to the inventive concepts.
Figure 29A:
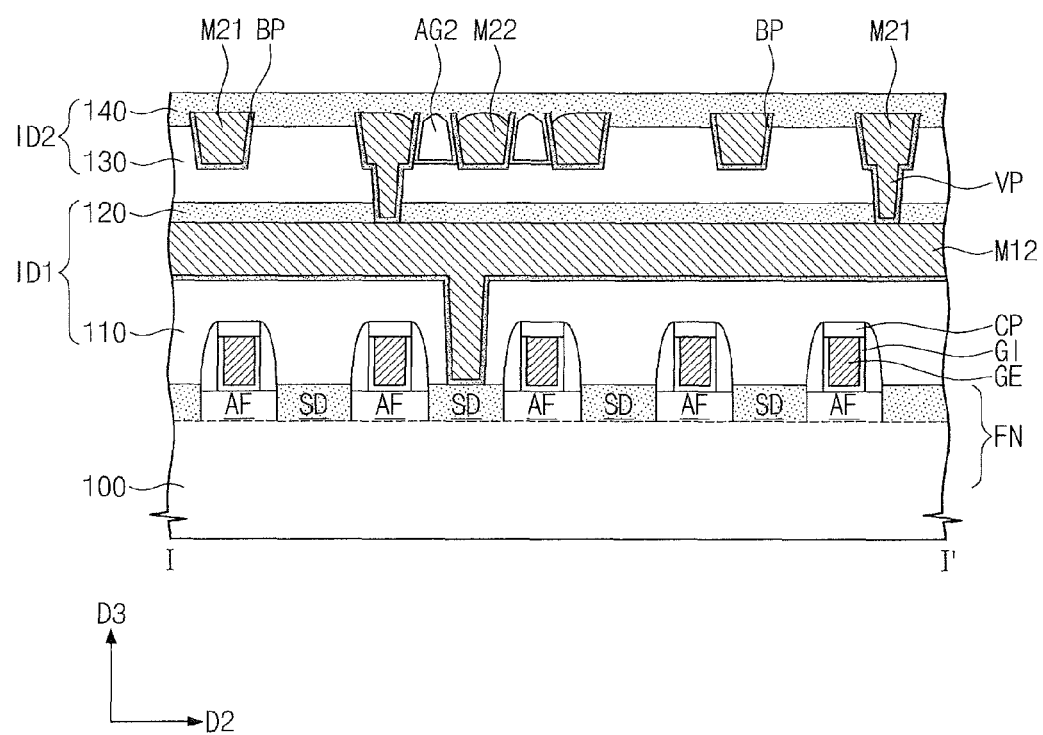
FIG. 29A and FIG. 29B are cross-sectional views taken along lines I-I' and II-II' of FIG. 28, respectively.
Figure 29B:
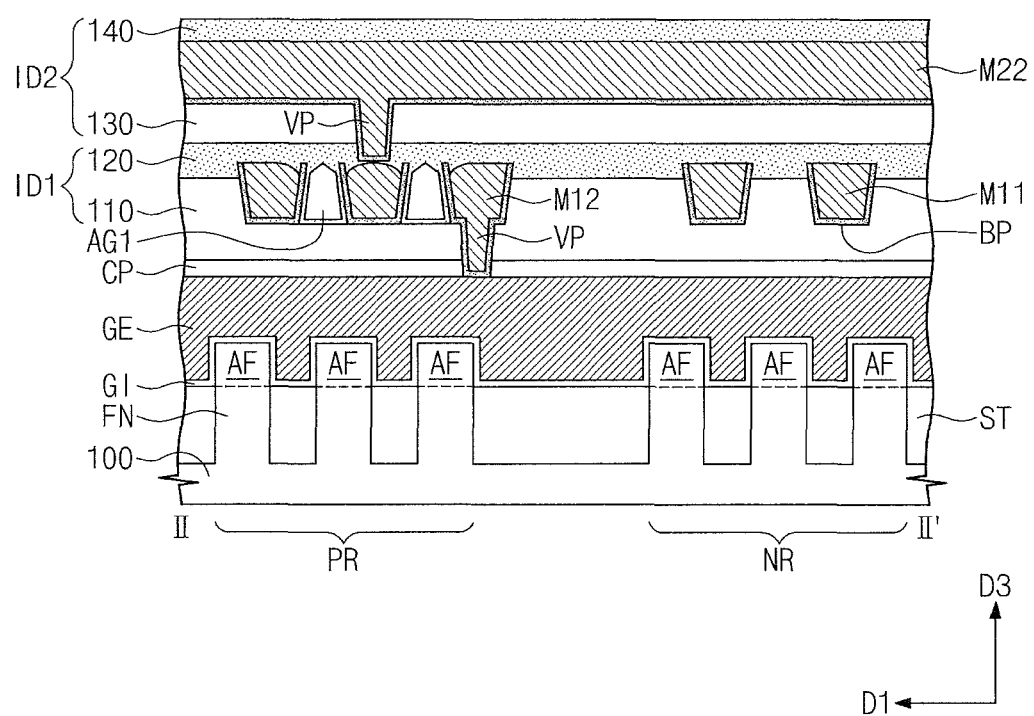

FIG. 28 is a plan view illustrating a semiconductor device according to some embodiments of the inventive concepts. FIG. 29A and FIG. 29B are cross-sectional views taken along lines I-I' and II-II' of FIG. 28, respectively. In the present embodiment, the descriptions to the same technical features as in the embodiment of FIG. 1, FIG. 2A, FIG. 2B, FIG. 3A, and FIG. 3B will be omitted or mentioned briefly for brevity and clarity of explanation. Instead, differences between the present embodiment and the embodiment of FIG. 1, FIG. 2A, FIG. 2B, FIG. 3A, and FIG. 3B will be described. For brevity and clarity, the lower and upper interconnections and air gaps are omitted in FIG. 28. However, the same lower and upper interconnections and air gaps as illustrated in FIG. 1 may be applied to the semiconductor device of FIG. 28.

Referring to FIG. 28, FIG. 29A, and FIG. 29B, an embodiment of a logic cell, (configured to process data), is illustrated. Device isolation layers ST may be provided in a substrate 100 to define active patterns FN. The device isolation layers ST may be formed in an upper portion of the substrate 100. For example, the substrate 100 may be a silicon substrate, a germanium substrate, or a silicon-on-insulator (SOI) substrate. For example, the device isolation layers ST may include a silicon oxide layer. In one embodiment, the device isolation layers ST are Shallow Trench Isolations (STI), wherein the active patterns FN are laterally disposed between the STI regions.

The active patterns FN may extend in a second direction D2. The active patterns FN may be arranged in a first direction D1 intersecting the second direction D2. In some embodiments, upper portions of the active patterns FN may include fin portions, respectively. In some embodiments, each of the fin portions may have a fin-shape protruding along the D3 axis, parallel to the device isolation layers ST.

Gate electrodes GE may be provided on the active patterns FN and may extend in the first direction D1. A gate dielectric layer GI may be provided under each of the gate electrodes GE, and gate spacers GS (not shown) may be provided on both sidewalls of each of the gate electrodes GE. A capping pattern CP may be provided to cover a top surface of each of the gate electrodes GE.

The gate electrodes GE may include at least one of a doped semiconductor material, a metal, or a conductive Metal Nitride. The gate dielectric layer GI may include at least one of a Silicon Oxide layer, a Silicon Oxynitride layer, or a High-K dielectric layer of which a dielectric constant is higher than that of a Silicon Oxide layer. Each of the capping pattern GP and the gate spacer GS may include at least one of Silicon Oxide, Silicon Nitride, or Silicon Oxynitride.

Source and drain regions SD may be provided on or in the active patterns FN at both sides of each of the gate electrodes GE. The fin portions disposed under each of the gate electrodes GE may be used as channel regions AF. Each of the channel regions AF may be disposed between the source and drain regions SD.

In some embodiments, the source and drain regions SD may include epitaxial patterns formed using a selective epitaxial growth (SEG) process. The source and drain regions SD may include a different semiconductor element from the substrate 100. In some embodiments, the source and drain regions SD may include a semiconductor element of which a lattice constant is greater or smaller than that of the semiconductor element of the substrate 100 (e.g., "strained silicon"). Because the source and drain regions SD include the different semiconductor element from the substrate 100, compressive stress or tensile stress may be provided to the channel regions AF.

A first interlayer insulating layer ID1 and a second interlayer insulating layer ID2 may be sequentially stacked on the substrate 100. The lower interconnections M11 and M12 may be disposed in the first interlayer insulating layer ID1, and the upper interconnections M21 and M22 may be disposed in the second interlayer insulating layer ID2. The first air gaps AG1 may be provided between the second lower interconnections M12, and the second air gaps AG2 may be provided between the second upper interconnections M22. The interlayer insulating layers ID1 and ID2, the lower and upper interconnections M11, M12, M21, and M22, and the first and second air gaps AG1 and AG2 may be the same as described above with reference to FIG. 1, FIG. 2A, FIG. 2B, FIG. 3A, and FIG. 3B.

In the semiconductor device according to some embodiments of the inventive concepts, the air gap may be disposed between the interconnections having the high pattern density. Thus, the parasitic capacitance between the interconnections may be reduced or minimized. In addition, the interconnections may be effectively insulated from each other, and thus the reliability of the semiconductor device may be improved. According to some embodiments of the inventive concepts, the height difference of the interlayer insulating layer may be removed without an additional process, and thus the process reliability may be improved (e.g. by improving step coverage of subsequently formed metallic interconnects).

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   an interlayer insulating layer including a first insulating layer on a substrate;
   a plurality of interconnections in the first insulating layer; and
   a plurality of barrier patterns between the interlayer insulating layer and the interconnections, respectively,
   wherein each of the barrier patterns covers a bottom surface and both sidewalls of each of the interconnections,
   wherein the interlayer insulating layer includes a first region, and a second region including an air gap,
   wherein the air gap is between a pair of the interconnections in the second region,
   wherein a top surface of the first insulating layer of the first region is lower than a top surface of at least one of the interconnections in the first region,
   wherein each of the pair of interconnections includes a first portion adjacent to the air gap and a second portion in a central region adjacent to the first portion,
   wherein a top surface of the first portion is lower than a top surface of the barrier pattern on at least one of the sidewalls,
   wherein a top surface of the second portion is higher than a top surface of the first portion, and
   wherein the top surface of the second portion is level with or lower than the top surface of the barrier pattern.

2. The semiconductor device of claim 1, wherein the interlayer insulating layer further includes a second insulating layer covering the first insulating layer, and
   wherein a top surface of the second insulating layer of the first region is coplanar with a top surface of the second insulating layer of the second region.

3. The semiconductor device of claim 2, wherein the air gap is surrounded by the second insulating layer, and
   wherein a thickness of the second insulating layer under the air gap is thicker than a thickness of the second insulating layer at a side of the air gap.

4. The semiconductor device of claim 1, wherein a pattern density of the interconnections of the first region is less than a pattern density of the interconnections of the second region.

5. The semiconductor device of claim 1, wherein at least one of the interconnections in the first region has a first recess formed on an edge thereof, the edge defined by a top surface of the first portion in contact with one of the sidewalls.

6. The semiconductor device of claim 1, wherein at least one of the pair of interconnections has a first recess and a second recess formed on both edges thereof, respectively, and
   wherein the second recess is deeper than the first recess, wherein each of the edges is defined by a respective top surface of the respective first portion in contact with a respective one of the sidewalls.

7. The semiconductor device of claim 1, wherein a width of the air gap decreases as a vertical distance from a top surface of the substrate increases.

8. The semiconductor device of claim 7, wherein a top of the air gap is higher than a top surfaces of each of the pair of interconnections.

9. The semiconductor device of claim 1, wherein the air gap extends parallel to the pair of interconnections in one direction.

10. The semiconductor device of claim 1, wherein the pair of interconnections extends in one direction,
    wherein a plurality of the air gaps is provided, and
    wherein the plurality of the air gaps are spaced apart from each other and are arranged parallel to the one direction between the pair of interconnections.

11. A semiconductor device comprising:
    an interlayer insulating layer on a substrate;
    a plurality of interconnections in the interlayer insulating layer; and
    a plurality of barrier patterns between the interlayer insulating layer and the interconnections, respectively,
    wherein each of the barrier patterns covers a bottom surface and both sidewalls of each of the interconnections,
    wherein the interlayer insulating layer includes a first region and a second region including an air gap,
    wherein the interconnections includes a first interconnection in the first region and a second interconnection in the second region,
    wherein the second interconnections includes a first portion adjacent to the air gap,
    wherein a top surface of the portion is lower than a top surface of the barrier pattern,
    wherein the second interconnection has a first recess formed on an edge thereof, the edge defined by a top surface of the first portion in contact with one of the sidewalls,
    wherein the first interconnection has a second recess formed on an edge thereof, the edge defined by a top surface of the first interconnection in contact with one of the sidewalls,
    wherein a bottom end of the first recess is lower than a bottom end of the second recess.

12. The semiconductor device of claim 11, wherein the interlayer insulating layer includes a insulating layer and a second insulating layer that are sequentially formed,
    wherein the second insulating layer covers top surfaces of the interconnections and surrounds the air gap, and
    wherein a top surface of the first insulating layer of the first region is lower than a top surface of at least one of the interconnections in the first region.

13. The semiconductor device of claim 11, wherein a top surface of the interlayer insulating layer of the first region is coplanar with a top surface of the interlayer insulating layer of the second region.

14. The semiconductor device of claim 11, wherein the second interconnections further includes a second portion in a central region thereof, and
    wherein a top surface of the second portion is higher than a top surface of the first portion.

15. A semiconductor device comprising:

an interlayer insulating layer on a substrate;

a plurality of interconnections in the interlayer insulating layer; and a plurality of barrier patterns between the interlayer insulating layer and the interconnections, respectively, wherein each of the barrier patterns covers a bottom surface and both sidewalls of each of the interconnections, wherein the interlayer insulating layer includes an air gap between first and second interconnections of the interconnections, wherein the first interconnection has a first recess formed on a first edge thereof and a second recess formed on a second edge thereof opposite to the first edge, wherein the first edge is defined by a top surface of the first interconnection in contact with one of the sidewalls, wherein the second edge is defined by the top surface of the first interconnection in contact with an opposing one of the sidewalls, wherein a bottom end of the first recess is lower than a bottom end of the second recess.

* * * * *